(12) United States Patent
Ueda et al.

(10) Patent No.: US 7,531,852 B2
(45) Date of Patent: May 12, 2009

(54) ELECTRONIC UNIT WITH A SUBSTRATE WHERE AN ELECTRONIC CIRCUIT IS FABRICATED

(75) Inventors: Nobumasa Ueda, Nagoya (JP); Hirokazu Kasuya, Aichi-ken (JP); Koji Numazaki, Aichi-ken (JP); Yutaka Fukuda, Kariya (JP); Mitsuhiro Saitou, Oobu (JP)

(73) Assignee: DENSO CORPORATION, Kariya (JP)

( * ) Notice: Subject to any disclaimer, the term of this patent is extended or adjusted under 35 U.S.C. 154(b) by 544 days.

(21) Appl. No.: 11/151,660

(22) Filed: Jun. 14, 2005

(65) Prior Publication Data

US 2005/0274982 A1 Dec. 15, 2005

(30) Foreign Application Priority Data

| Jun. 14, 2004 | (JP) | ............................. 2004-175585 |
| Jun. 30, 2004 | (JP) | ............................. 2004-193556 |
| Jun. 30, 2004 | (JP) | ............................. 2004-193558 |
| Dec. 1, 2004 | (JP) | ............................. 2004-348544 |

(51) Int. Cl.
*H01L 21/82* (2006.01)

(52) U.S. Cl. .................. 257/203; 257/692; 438/128; 438/129

(58) Field of Classification Search ............... 257/203, 257/692; 438/128, 129
See application file for complete search history.

(56) References Cited

U.S. PATENT DOCUMENTS

| 3,889,459 | A | 6/1975 | Lu |
| 5,428,885 | A | 7/1995 | Takaya et al. |
| 5,448,180 | A | 9/1995 | Kienzler et al. |
| 5,543,754 | A | 8/1996 | Onodera |
| 5,892,893 | A | 4/1999 | Hanf et al. |
| 6,115,831 | A | 9/2000 | Hanf et al. |
| 6,118,267 | A | 9/2000 | Eitan et al. |
| 6,236,194 | B1 | 5/2001 | Manabe et al. |
| 6,396,282 | B1 | 5/2002 | Minuth et al. |
| 6,405,330 | B1 | 6/2002 | Hanf et al. |

(Continued)

FOREIGN PATENT DOCUMENTS

EP 0 420 703 A2 9/1990

(Continued)

OTHER PUBLICATIONS

Japanese Patent Application No. 2004-171221.

(Continued)

*Primary Examiner*—Joseph Chang
(74) *Attorney, Agent, or Firm*—Posz Law Group, PLC

(57) ABSTRACT

In an electronic unit with a substrate, a control circuit is mounted on the substrate and is configured to execute an operation related to a load. A package encapsulates the control circuit and the substrate. The package has sides around a periphery of the substrate. At least one input terminal for input of a signal externally sent to the electronic unit is disposed on at least one of the plurality of surfaces. At least one output terminal for output of a control signal for controlling the load is disposed on at least another one of the plurality of surfaces. At least one check terminal for input/output of a signal for checking at least the control circuit is disposed on at least another one of the plurality of surfaces.

14 Claims, 14 Drawing Sheets

U.S. PATENT DOCUMENTS

| | | |
|---|---|---|
| 6,476,445 B1 | 11/2002 | Brown et al. |
| 6,479,883 B1 | 11/2002 | Chen et al. |
| 6,600,723 B1 | 7/2003 | Reeb et al. |
| 2002/0153538 A1* | 10/2002 | Kawai ................ 257/203 |
| 2002/0153564 A1 | 10/2002 | Shirai |
| 2003/0084363 A1 | 5/2003 | Barrenscheen et al. |
| 2004/0090273 A1 | 5/2004 | Chang et al. |
| 2004/0155636 A1 | 8/2004 | Fukui et al. |
| 2004/0174149 A1 | 9/2004 | Agari et al. |
| 2004/0245622 A1* | 12/2004 | Shimanuki et al. ......... 257/690 |

FOREIGN PATENT DOCUMENTS

| | | |
|---|---|---|
| EP | 0 683 519 | 11/1995 |
| EP | 0 697 732 | 2/1996 |
| GB | 2 382 476 | 5/2003 |
| JP | 57-23324 | 2/1982 |
| JP | A-63-291106 | 11/1988 |
| JP | 2-187054 | 7/1990 |
| JP | A-H02-291714 | 12/1990 |
| JP | 6-37600 | 2/1994 |
| JP | 6-505140 | 6/1994 |
| JP | 6-204356 | 7/1994 |
| JP | A-UM-H06-085525 | 12/1994 |
| JP | 7-67293 | 3/1995 |
| JP | 10-24783 | 1/1998 |
| JP | 10-105309 | 4/1998 |
| JP | 10-229327 | 8/1998 |
| JP | 10-303341 | 11/1998 |
| JP | 11-187571 | 7/1999 |
| JP | 2000-23463 | 1/2000 |
| JP | 2000-138343 | 5/2000 |
| JP | 2000-184694 | 6/2000 |
| JP | 2000-287446 | 10/2000 |
| JP | 2000-357947 | 12/2000 |
| JP | 2001-257366 | 9/2001 |
| JP | 3-276906 | 12/2001 |
| JP | 2002-287833 | 10/2002 |
| JP | A-2003-029854 | 1/2003 |
| JP | 2004-62331 | 2/2004 |
| JP | A-2004-133800 | 4/2004 |
| WO | WO 03/077408 | 9/2003 |

OTHER PUBLICATIONS

Japanese Patent Application No. 2004-200448.
European Search Report dated Oct. 21, 2008 in corresponding European patent application No. 05012797.6-1242 (and English translation).
Walsh, M., *Diode Implements Reverse Battery Protection*, EDN Electrical Design News, Reed Business Information, Highlands Ranch, Co., US, vol. 38, No. 20, Sep. 30, 1993.
Office communication dated Jun. 20, 2008 in corresponding European Patent Application No. 05012797.6-1242.
Office communication dated Jun. 10, 2008 in corresponding Japanese Patent Application No. 2004-193558 (and English translation).
Office Action dated Feb. 4, 2009 in corresponding Japanese Patent Application No. 2004-193556 (and English translation).

* cited by examiner

| 91 | 94 |
|---|---|
| 92 | 93 |

MOTOR STOP

| OFF | OFF |
|---|---|
| OFF | OFF |

ROLL UP

| ON | OFF |
|---|---|
| OFF | ON |

ROLL DOWN

| OFF | ON |
|---|---|
| ON | OFF |

ELECTRONIC UNIT WITH A SUBSTRATE WHERE AN ELECTRONIC CIRCUIT IS FABRICATED

CROSS REFERENCE TO RELATED APPLICATIONS

This application is based on Japanese Patent Applications 2004-175585, filed on Jun. 14, 2004, 2004-193556, filed on Jun. 30, 2004, 2004-193558, filed on Jun. 30, 2004, and 2004-348544, filed on Dec. 1, 2004. This application claims the benefit of priority therefrom, so that the descriptions of which are all incorporated herein by reference.

BACKGROUND OF THE INVENTION

1. Field of the Invention

The present invention relates to electronic units each having a substrate (board) where an electronic circuit is fabricated.

More particularly, the present invention relates to:

first type of electronic units each having a substrate where at least one control circuit for controlling at least one load is fabricated;

second type of electronic units each having a substrate where a clock generator for generating a clock composed of a repetitive series of pulses (clock pulses) to be fed to semiconductor elements, which constitute, for example, a microcomputer, is fabricated; and third type of electronic units each having a semiconductor substrate, such as a silicon substrate, where at least one semiconductor circuit is fabricated.

2. Description of the Related Art

The conventional first type of electronic units is designed to, for example, drive various types of motors installed in a vehicle.

Specifically, one of the first type electronic units is provided with a control module mainly composed of control elements that constitute a microcomputer and/or a control IC (integrated circuit). The electronic unit is provided with a drive module mainly composed of drive elements, such as power elements. For example, the power elements include DMOS FETs (Double diffused MOS FETS) and/or IGBTs (Insulated Gate Bipolar Transistors).

The first type electronic units can be designed to a hybrid IC (HIC) to be applied to various devices and apparatuses as, for example, a drive circuit for an actuator, such as a motor. Conventionally, an example of the first type electronic units, which is designed to the HIC to be applied to a vehicle as a drive circuit for a motor of a power window of a vehicle, is disclosed in Japanese Unexamined Patent Publication No. H7-67293.

In a vehicle, such as an automobile, a plurality of the electronic units, which are designed to the HICs, are installed. The electronic units are communicably coupled to each other through an in-vehicle LAN (Local Area Network).

CAN (Controller Area Network) protocol and LIN (Local Interconnect Network) protocol are some of the standard communication protocols for the in-vehicle LAN.

FIG. 21 illustrates a structural example of the in-vehicle LAN using the LIN protocol. A plurality of the electronic units serving as master electronic control units (ECUs) and slave ECUs provide the in-vehicle LAN.

Each of the master ECUs is operative to send/receive data to/from the slave ECUs and/or another master ECU. Each of the slave ECUs is operative to communicate with the master ECUs using the LIN protocol. Specifically, each of the slave ECUs is electrically connected to a load, such as a motor, and is operative to receive signals based on the UN protocol from at least one of the master ECUs; these signals to be communicated based on the LIN protocol are referred to as "UN signals". At least one of the slave ECUs is configured to drive the load based on the received LIN signals.

Each of the slave ECUs has a plurality of input terminals including first terminals at which the LIN signals can be input from the master ECUs, and has a plurality of output terminals including second terminals at which drive signals can be output to the corresponding load.

When checking one of the slave ECUs as a check target slave ECU, LIN signals for check are input from the first terminals in the input terminals while a monitoring device, such as a probe, is connected to one of the output terminals and various terminals mounted on the substrate of the check-target slave ECU. The monitoring device is connected to, for example, a display, so that input-output characteristics of the check-target slave ECU through one of the output terminals and the various terminals in response to the input LIN signals for check are monitored on the display.

The destination of the monitoring device is sequentially changed to another terminal in the output terminals and the various terminals every time one of the input-output characteristics of the check-target slave ECU through one of the output terminals and the various terminals has been completed. This allows the input-output characteristics of the check-target slave ECU through all of the output terminals and the various terminals to be checked.

The check method set forth above, however, may cause the check efficiency to deteriorate due to the connection works of the monitoring device to each of the output terminals and the various terminals.

It is assumed that such a save ECU is downsized to be packaged using a mold resin. In this assumption, however, it may be difficult to connect the monitoring device to each of the various terminals mounted on the substrate of the slave ECU packaged by the mold resin. This may complicate checking of elements, such as a microcomputer and the like, fabricated on the substrate.

On the other hand, clock generators are operative to generate a clock to be fed to semiconductor elements, which constitute, for example, a microcomputer. The clock generators can be designed using a crystal oscillator, a ceramic oscillator, or a capacitance-resistance (CR) oscillation circuit composed of a capacitor and a resistor; an example of these clock generators is disclosed in Japanese Unexamined Patent Publication NO. 2000-357947.

Some of the clock generators each designed to use the crystal oscillator or the ceramic oscillator have been widely used because they are capable of generating a clock with high oscillation accuracy.

The crystal oscillator or the ceramic oscillator however has a difficulty in being integrated with other elements on a single substrate and being packaged by a mold resin. This reason is as follows:

Specifically, the crystal oscillator or the ceramic oscillator has a limit of miniaturization. In addition, the crystal oscillator or the ceramic oscillator is complex in structure because it is configured to oscillate in its inner following portion. The mold package may therefore apply stress on the crystal oscillator or the ceramic oscillator, causing its oscillation accuracy and/or its lifetime to deteriorate.

For these reasons, it may be hard to install the crystal oscillator or the ceramic oscillator in an electronic unit configured to a hybrid IC (Integrated Circuit) or a multi-chip package composed of a plurality of chips mounted on a single substrate and packaged by a mold resin.

In contrast, some of the clock generators each designed to use the CR oscillation circuit can be integrated with other elements on a single substrate because the CR oscillation circuit has a simple structure using resistor(s) and capacitor (s). This allows the CR oscillation circuit to be installed in an electronic unit that is configured to the hybrid IC or the multi-chip package because the CR oscillation circuit can be installed in the interior of an IC fabricated in the hybrid IC or the multi-chip package.

The clock generators each using the CR oscillation circuit, however, may cause variations of resistor's resistances and those of capacitor's capacitances in manufacturing the CR oscillation circuits to have deleterious effect on the oscillation frequencies of the clocks. This may make it difficult for the clock generators each using the CR oscillation circuit to generate a clock whose oscillation frequency has a high accuracy.

In addition, as an example of the conventional third type of electronic units, a monolithically integrated circuit is disclosed in U.S. Pat. No. 5,448,180 corresponding to Japanese Patent Publication No. 3179098.

The monolithically integrated circuit disclosed in the U.S. patent is provided with a protection circuit composed of diodes D1 and D2 in FIG. 1 of the U.S. patent. The diodes D1 and D2 is configured to protect transmitter end stages of the circuit and maintain its full function in the event of a short circuit of bus lines to a voltage supply or ground (i.e., in the event of a short circuit of terminals $CAN_H$ and $CAN_L$ to $+V_{CC}$ or $V_{SS}$).

The invention disclosed in the U.S. patent has a structure to protect the transmitter end stages of the circuit in the event of the short circuit of the bus lines to the voltage supply or ground. The invention disclosed in the U.S. patent may not disclose how to deal with cases where foreign noises each having a voltage higher than that of a voltage supplied from the voltage supply $+V_{CC}$ enter into the bus lines.

As an example of circuits for protecting an output circuit from such foreign noises, a circuit with Zener diodes 534a and 534b as bus protection diodes, which are connected between a bus B and a ground, has been known (see FIG. 22).

Specifically, FIG. 22 illustrates a circuit structure of an ECU 502 installed in a vehicle or the like. The ECU 502 includes semiconductor circuits, such as a peripheral IC 531, a communication transceiver 532, and an MPU (Micro Processing Unit) 540. The ECU 502 also includes a power supply terminal 521, a ground terminal 522, and a communication bus terminal 523. The power supply terminal 521 is connected to the positive terminal of a battery 501 via a power supply cable, and the ground terminal 522 is connected to the negative terminal of the battery 501 via a power supply cable. The communication transceiver 532 is connected through the bus B to communication transceivers (each also referred to as corn TB in FIG. 22) 505, which are disposed at the exterior of the ECU 502.

The Zener diodes 534a and 534b connected back-to-back as the bus protection diodes are provided between the communication bus terminal 523 and the ground terminal 522. The diodes 534a and 534b are operative to protect the communication transceiver 532 from surges and/or noises entering from the exterior of the ECU 502 through the bus B and the communication bus terminal 523.

When a voltage due to the surges and/or noises, which is higher than a Zener breakdown voltage of each Zener diode, is applied between the communication bus terminal 523 and the ground terminal 522, the Zener diodes 534a and 534b allow a current to flow therethrough and not to flow through the communication transceiver 532. This prevents the voltage higher than the Zener breakdown voltage of each of the Zener diodes 534a and 534b from being applied to the communication transceiver 532.

In addition, a reverse-connection protection diode 533 is connected in series between the power supply terminal 521 of the ECU 502 and a power supply terminal of each of the semiconductor circuits installed in the ECU 502. The reverse-connection protection diode 533 can cutoff a reverse current trying to flow from a ground terminal of each of the semiconductor circuits to the power supply terminal thereof when an accidental reversal of the battery 501 occurs.

When, for example, each of the semiconductor circuits 531 and 532 is mounted in a single substrate to be installed in a single chip, it is preferable to fabricate the reverse-connection protection diode 533 and each of the bus protection diodes 534a and 534b in the same chip of the semiconductor circuit 531 or the semiconductor circuit 532. This aims at downsizing of the ECU 502, reduction of the number of elements of the ECU 502, and reduction of the number of man-hours required to assemble the ECU 502.

When fabricating the reverse-connection protection diode 533 and/or each of the bus protection diodes 534a and 534b in the same substrate in which the peripheral IC 531 or the communication transceiver 532 is formed, the following problems may be encountered due to a parasitic diode. The parasitic diode is formed based on a P-N junction of each of the diodes 533, 534a and 534b.

The parasitic diode will be described hereinafter with reference to FIG. 23. FIG. 23 is a schematic cross sectional view of one of the diodes 533, 534a and 534b formed in the substrate in which the peripheral IC 531 or the communication transceiver 532 is fabricated.

As illustrated in FIG. 23, an N epitaxial region 563 is grown on a P type semiconductor substrate 561, and anode regions 570 and a cathode region 571 are formed in the N epitaxial region 563. An anode terminal 533a is connected to each of the anode regions 570, and a cathode terminal 533b is connected to each of the cathode region 571 and the N epitaxial region 563. The P type semiconductor substrate 561 is electrically connected to the ground terminal of the peripheral IC 531 or the communication transceiver 532.

The structure of each of the diodes 533, 534a and 534b formed in the substrate in which the peripheral IC 531 or the communication transceiver 532 is formed provides a parasitic diode PD in a junction between the P type semiconductor substrate 561 and the N epitaxial region 563.

When the reverse-connection protection diode 533 is fabricated in the same substrate (same chip) of the peripheral IC 531 or the communication transceiver 532, accidental reversal of the battery 501 (see FIG. 22) may cause potential at the positive terminal of the battery 501 to be applied to the P type semiconductor substrate 561. This may cause the parasitic diode to be biased in the forward direction, making it difficult to cutoff the reverse current flowing from the ground terminal to the power supply terminal of the peripheral IC 531 or the communication transceiver 532.

When the bus protection diodes 534a and 534b are fabricated in the same substrate (same chip) of the peripheral IC 531 or the communication transceiver 532, it is assumed that breaking of the power supply cable or disconnection thereof between the negative terminal of the battery 501 and the ground terminal 522 of the ECU 502 occurs. In this assumption, the breaking of the power supply cable or disconnection thereof between the negative terminal of the battery 501 and the ground terminal 522 may cause a current not to flow from the peripheral IC 531 or the communication transceiver 532 to the negative terminal of the battery 501. This may put potential at the ground terminal 522 into floating potential.

In this case, a current pulling in the ECU 502 from the communication transceivers 505 connected to the bus B may increase potential of the P type semiconductor substrate 561, causing the parasitic diode to be biased in the forward direction, This may cause a current to flow through a path A (see FIG. 22) including the parasitic diode PD into the bus B.

The current flow out of the ECU 502 to the bus B may cause interferences through the communication transceivers 505 connected thereto.

These reasons set forth above may oblige the reverse-connection protection diode 533 to be arranged at the exterior of the peripheral IC 531 and at the exterior of the communication transceiver 532 as a discrete element. Similarly, the bus protection diodes 534a and 534b are forced to be arranged at the exterior of the peripheral IC 531 and at the exterior of the communication transceiver 532 as discrete elements.

SUMMARY OF THE INVENTION

The present invention has been made on the background above so that a preferable embodiment of the present invention provides an electronic unit capable of checking elements fabricated in a substrate of the electronic unit with the size thereof being compact.

Another preferable embodiment of the present invention provides an electronic unit using a CR oscillation circuit, which is capable of generating a clock with a high oscillation frequency.

A further preferable embodiment of the present invention provides an electronic unit having a semiconductor substrate on/in which at least one electronic circuit is fabricated, and allowing a reverse-connection protection diode and/or a bus protection diode to be formed on/in the same semiconductor substrate.

According to one aspect of the present invention, there is provided an electronic unit with a substrate. The electronic unit includes a control circuit mounted on the substrate and configured to execute a control operation related to a load, and a package encapsulating the control circuit and the substrate. The package has a plurality of sides around a periphery of the substrate. The electronic unit includes at least one input terminal for input of a signal externally sent to the electronic unit. The at least one input terminal is disposed on at least one of the plurality of surfaces. The electronic unit includes at least one output terminal for output of a control signal for controlling the load. The at least one output terminal is disposed on at least another one of the plurality of surfaces. The electronic unit includes at least one check terminal for input/output of a signal for checking at least the control circuit. The at least one check terminal is disposed on at least another one of the plurality of surfaces.

According to another aspect of the present invention, there is provided an electronic unit with a substrate. The electronic unit includes a first integrated circuit mounted on the substrate and having a clock terminal. The first integrated circuit is designed to operate based on a clock with a predetermined operation frequency. The electronic unit includes a second integrated circuit having a CR oscillation circuit and mounted on the substrate. The CR oscillation circuit has a resistor and a capacitor. The CR oscillation circuit is configured to generate a signal with a predetermined oscillation frequency based on a time constant determined by a resistance of the resistor and a capacitance of the capacitor, and supply the generated signal to the clock terminal as the clock. The resistor is laser-trimmed such that the oscillation frequency of the signal substantially coinciding with the predetermined operation frequency.

According to a further aspect of the present invention, there is provided an electronic unit with a substrate. The electronic unit includes a first integrated circuit mounted on the substrate and having a clock terminal. The first integrated circuit is designed to operate based on a clock with a predetermined operation frequency. The electronic unit includes a second integrated circuit having a CR oscillation circuit and mounted on the substrate. The CR oscillation circuit has a resistor and a capacitor. The electronic unit includes a time-constant adjustment unit connected to the CR oscillation circuit and configured to adjust the time constant of the resistor and the capacitor. The CR oscillation circuit is configured to generate a signal with a predetermined oscillation frequency based on the time constant adjusted by time-constant adjustment circuit, and supply the generated signal to the clock terminal as the clock.

According to a still further aspect of the present invention, there is provided an electronic unit with a semiconductor substrate. The electronic unit includes a semiconductor layer formed in the semiconductor substrate, a semiconductor circuit formed in a first predetermined region of the semiconductor substrate, and a diode formed in a second predetermined region of the semiconductor substrate different from the first predetermined region. The diode is composed of an anode region and a cathode region, and the anode region is connected to a positive terminal of a battery. The cathode region is connected to the semiconductor circuit. The electronic unit includes an insulating member formed in the semiconductor substrate and so arranged as to electrically isolate the second predetermined region from the semiconductor substrate.

According to a still further aspect of the present invention, there is provided an electronic unit with a semiconductor substrate. The electronic unit includes a semiconductor layer formed in the semiconductor substrate, a communication circuit formed in a first predetermined region of the semiconductor substrate and connected to an external communication bus through a bus terminal, and a bus protection diode member formed in a second predetermined region of the semiconductor substrate different from the first predetermined region. The bus protection diode member is connected between a ground terminal and the communication bus terminal. The ground terminal is connected to a negative terminal of a battery. The electronic unit includes an insulating member formed in the semiconductor substrate and so arranged as to electrically isolate the second predetermined region from the semiconductor substrate.

BRIEF DESCRIPTION OF THE DRAWINGS

Other objects and aspects of the invention will become apparent from the following description of embodiments with reference to the accompanying drawings in which:

FIG. 22 is a block diagram illustrating a circuit structure of an ECU installed in a vehicle or the like.

DETAILED DESCRIPTION OF EMBODIMENTS OF THE INVENTION

Embodiments of the present invention will be described hereinafter with reference to the accompanying drawings.

First Embodiment

As an example of electronic units according to a first embodiment of the present invention, a door ECU will be typically described hereinafter. The door ECU 1 according to the first embodiment is operative to control the drive of at least one motor 100 (see FIGS. 2 and 3) as an actuator in a power window system for a window-glass of each door of a vehicle. The door ECU 1 is installed in a housing of the motor disposed in each door of the vehicle. The door ECU 1 serves as a slave ECU to bi-directionally communicate with at least one master ECU (not shown) based on the LIN protocol.

Figure 1:
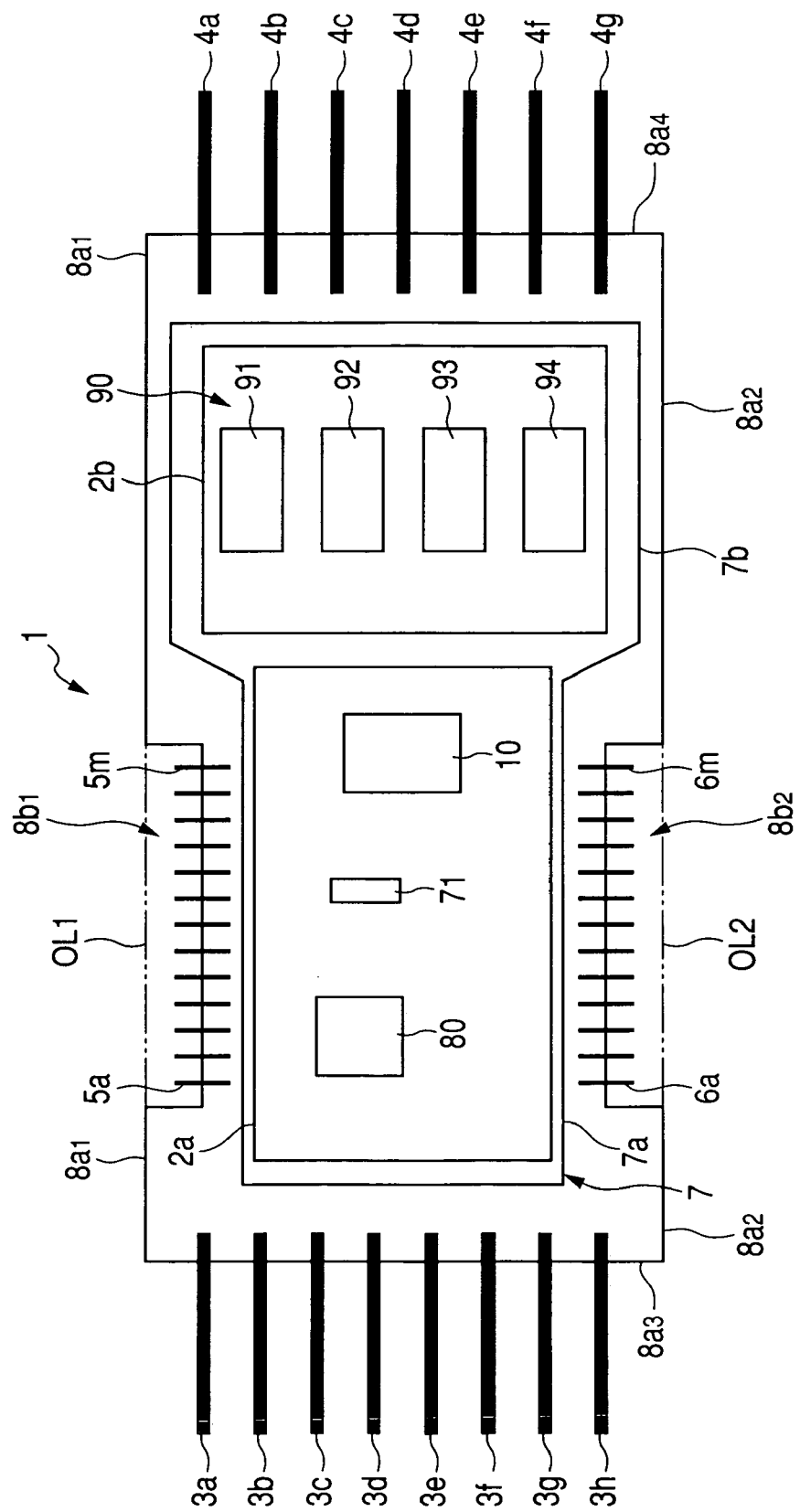
FIG. 1 is a plan view schematically illustrating a door ECU according to a first embodiment of the present invention.

FIG. 1 is a plan view schematically illustrating the door ECU 1. The door ECU 1 is provided with a multilayer board, such as six-layer board, 2a on which a control IC 10 with a power supply module PM (see FIG. 4), a microcomputer 80, and a capacitor 71 are mounted. In addition, the door ECU 1 is provided with a single layer board 2b on which a load drive circuit 90 composed of power transistors 91 to 94 as an example of power elements are mounted. The door ECU 1 is provided with a heat sink 7 serving as a base portion on which the multilayer board 2a and the single layer board 2b are fixedly mounted with an adhesive or the like.

The multilayer board 2a has a substantially rectangular-parallelepiped shape, and includes outer layers and a plurality of inner layers for conductor routing. The one or more inner layers are, for example, one or more conductive film layers made of, for example, copper (Cu). The single layer board 2b has a substantially rectangular parallelepiped shape, and contains metallized conductive film layers made of, for example, silver (Ag) on one side of the board 2b. The single layer board 2b can be replaced by a multilayer board.

The heat sink 7 has a substantially T shape. Specifically, the heat sink 7 is composed of a first portion 7a having a substantially rectangular parallelepiped shape, and a second portion 7b having a substantially rectangular parallelepiped shape and extending from the first portion 7a such that the width of the second portion 7b is wider than that of the first portion 7a.

The multilayer board 2a is arranged on the first portion 7a of the heat sink 7 such that the longitudinal sides of the board 2a are parallel to those of the first portion 7a. The single layer board 2b is arranged on the second portion 7b of the heat sink 7 such that one of the longitudinal sides of the single layer board 2b is parallel to one of the lateral sides of the multilayer board 2a.

The control IC 10, the microcomputer 80, and the power transistors 91 to 94 are designed to chip modules to be mounted as bare chips on the multilayer board 2a or the single layer board 2b, respectively. These chips of the elements 10, 80, and 91 to 94 are formed with a plurality of pads made of, for example, aluminum (Al), respectively. A conductor pattern formed on each of the boards 2a and 2b and the pads of the elements 10, 80, and 91 to 94 are electrically connected to each other with bonding wires.

The control IC 10, the microcomputer 80, the capacitor 71, and the multilayer board 2a constitute a hybrid circuit.

The door ECU 1 is provided with a plurality of input terminals 3a to 3h, a plurality of output terminals 4a to 4g, a plurality of first check terminals 5a to 5m, and a plurality of second check terminals 6a to 6m. The terminals 3a to 3h, 4a to 4g, and 5a to 5m are disposed around the multilayer board 2a and the single layer board 2b.

In the door ECU 1, the IC 10, the microcomputer 80, the capacitor 71, the boards 2a and 2b, the power transistors 91 to 94, the heat sink 7, the bonding wires, and the lead terminals 3a to 3h, 4a to 4g, 5a to 5m, 6a to 6m are encapsulated in a protective mold material to form a package 8.

Specifically, the package 8 based on the mold material is designed such that the outside shape of the package 8 is a substantially cuboid shape. As the protective mold material, for example, ceramic, plastic, resin, or another similar material can be used. Each of the lead terminals 3a to 3h, 4a to 4g, 5a to 5m, and 6a to 6m is configured to project to extend to the outside of the package 8.

The input terminals 3a to 3h serve mainly as terminals for input of externally entered signals, which are sent, for example, from the master ECU.

Specifically, the input terminal 3*a* is a ground (GND) terminal connected to the negative terminal of a battery, and the input terminal 3*b* is a switch signal terminal for input of switch signals, such as voltage signals, in response to the shift of a power-window switch to the predetermined up position. The input terminal 3*c* is a switch signal terminal for input of switch signals, such as voltage signals, in response to the shift of the power-window switch to the predetermined down position.

The input terminal 3*d* is a switch signal terminal for input of switch signals, such as voltage signals, in response to automatic down operations, and the input terminal 3*e* is a switch signal terminal for input of switch signals in response to automatic up operations.

The input terminal 3*f* is a switch signal terminal for input of key switch signals, such as voltage signals, in response to engine-key operations, and the input terminal 3*g* is a LIN signal input/output terminal for input/output of LIN signals, such as voltage signals, from/to the at least one master ECU. The input terminal 3*h* is a battery terminal (+B) connected to the positive terminal of the battery.

The output terminals 4*a* to 4*g* serve mainly as terminals for output of signals for drive of the motor 100. Specifically, the output terminal 4*a* and 4*e* are ground (GND) terminals connected to the negative terminal of the battery, and the output terminal 4*b* is a motor-connection terminal connected to the positive terminal of the motor 100. The output terminal 4*d* is a motor-connection terminal connected to the negative terminal of the motor 100, and the output terminal 4*c* is a battery terminal (+B) connected to the positive terminal of the battery. The output terminal 4*f* is a power supply terminal connected to the power supply terminal of a Hall sensor for sensing the number of resolutions of the motor 100. The output terminal 4*g* is a sensor input terminal for input of motor resolution information, such as information indicative of the number of resolutions of the motor 100, outputted from the Hall sensor.

In the output terminals 4*a* to 4*d*, the motor connection terminals 4*b* and 4*d* are arranged on both sides of the battery terminal 4*c*, respectively. The ground terminals 4*a* and 4*e* are arranged outside to the motor connection terminals 4*b* and 4*d*, respectively, Comparatively high current fed from one of the motor connection terminals 4*b* and 4*d* flows through the motor 100 into the other of the motor connection terminals 4*b* and 4*d*.

When the rotation direction of the motor 100 is changed, high current switching noises may be transferred from the motor 100 to the motor connection terminals 4*b* and 4*d*.

In the first embodiment, however, the motor connection terminals 4*b* and 4*d* are sandwiched between the ground terminal 4*a* and the battery terminal 4*c* and between the battery terminal 4*c* and the ground terminal 4*e*, respectively. This arrangement prevents the high current switching noises from radiating out from the space between the terminals 4*a* and 4*c* and that between the terminals 4*c* and 4*e*.

The check terminals 5*a* to 5*m* and 6*a* to 6*m* serve mainly as terminals for input/output of signals for check. Specifically, the check terminals 5*a* to 5*m* and 6*a* to 6*m* include LIN signal input terminals for input of the LIN signals for check, and parallel input terminals for parallel input of level signals for check; these level signals correspond to the switch signals set forth above, respectively.

In addition, the check terminals 5*a* to 5*m* and 6*a* to 6*m* include parallel output terminals for parallel output of level signals for check; these level signals serve as control of the motor 100. The parallel input and output terminals are connected to the control IC 10 and the microcomputer 80.

Note that, when checking the door ECU 1 before shipment, after the ECU 1 has been booted, the LIN signals for check or the level signals for check are input from the LIN signal input terminals or the parallel input terminals into the microcomputer 80. For example, determination of whether the control signals outputted from the parallel output terminals based on the input LIN signals or the level signals are normal allows the operation check of the microcomputer 80 to be carried out.

The check terminals 5*a* to 5*m* and 6*a* to 6*m* are used before the door ECU 1 is installed in the housing of the motor 100 before shipment, and therefore, they are unused after the door ECU 1 has been installed in the housing of the motor 100.

In the first embodiment, the check terminals 5*a* to 5*m* and 6*a* to 6*m* are therefore arranged such that they are prevented from contacting to the vicinity of the door ECU 1 that has been installed in the housing of the motor 100.

Specifically, the package 8 has longitudinal side surfaces 8*a*1 and 8*a*2 opposite to each other, and lateral side surfaces 8*a*2 and 8*a*3 opposite to each other. The longitudinal side surface 8*a*1 is orthogonal to each of the lateral side surfaces 8*a*3 and 8*a*4, and the longitudinal side surface 8*a*2 is orthogonal to each of the lateral side surfaces 8*a*3 and 8*a*4.

The longitudinal side surfaces 8*a*1 and 8*a*2 have concave portions 8*b*1 and 8*b*2, respectively, and the concave portions 8*b*1 and 8*b*2 are arranged substantially in opposite to each other. The check terminals 5*a* to 5*m* are parallely disposed on the concave portion 8*b*1 such that they do not project from an outline OL1 of the portion of the longitudinal side surface 8*a*1 except for the concave portion 8*b*1. Similarly, the check terminals 6*a* to 6*m* are parallely disposed through the concave portion 8*b*2 such that they do not project from an outline OL2 of the portion of the longitudinal side surface 8*a*2 except for the concave portion 8*b*2.

These configurations of the check terminals 5*a* to 5*m* and 6*a* to 6*m* allow them to be prevented from contacting to the vicinity of the door ECU 1 that has been installed in the housing of the motor 100.

In addition, the input terminals 3*a* to 3*h* are parallely disposed through the lateral side surface 8*a*3 to project to the outside of the package 8, and the output terminals 4*a* to 4*g* are parallely disposed through the lateral side surface 8*a*4 to project to the outside of the package 8.

Specifically, the terminals 3*a* to 3*h*, 4*a* to 4*g*, 5*a* to 5*m*, and 6*a* to 6*m* are disposed through the side surfaces of the package 8, respectively, as a QFP (Quad Flat Package), making it possible to downsize the door ECU 1.

In addition, the number of the input terminals 3*a* to 3*h*, the number of the output terminals 4*a* to 4*g*, and that of the check terminals 5*a* to 5*m* and 6*a* to 6*m* are determined to 8, 7, and 26, respectively. Specifically, the number of the input terminals 3*a* to 3*h* and that of the output terminals 4*a* to 4*g* are smaller than that of the check terminals 5*a* to 5*m* and 6*a* to 6*m*. The input terminals 3*a* to 3*h* and the output terminals 4*a* to 4*g* are therefore disposed through the lateral side surfaces 8*a*3 and 8*a*4 of the package 8, respectively. Similarly, the check terminals 5*a* to 5*m* and 6*a* to 6*m* are therefore disposed through the longitudinal side surfaces 8*a*1 and 8*a*2 of the package 8, respectively. This is because the length of each of the lateral side surfaces 8*a*3 and 8*a*4 is shorter than that of each of the longitudinal side surfaces 8*a*1 and 8*a*2.

That is, the input terminals, output terminals, and check terminals are arranged depending on the length of each of the side surfaces of the package 8, allowing the size of the door ECU 1 to be reduced.

The microcomputer 80, the control IC 10, and the load drive circuit 90 is arranged on the heat sink 7 from its input-terminal side end thereof to its output-terminal side end in this order.

Specifically, the microcomputer 80 is arranged on the input-terminal side end of the heat sink 7, and the load drive circuit 90 is arranged on the output-terminal side end thereof such that the load drive circuit 90 is far from the microcomputer 80. This arrangement allows influence of the high current switching noises transferred from the motor 100 on the microcomputer 80 to be reduced.

In the first embodiment, the control IC 10 is designed to an IC using an SOI (Silicon On Insulator) substrate and having a high-breakdown voltage of, for example, approximately 40 V. The microcomputer 80 is designed to a low-breakdown voltage LSI operating on a voltage of 5 V. Each of the power transistors 91 to 94 is designed to a power element, such as a power MOS FET, manufactured using a DMOS process.

Next, flows of the LIN signals in the door ECU 1 will be described with reference to FIG. 2. The LIN signals are inputted from the LIN signal input terminal 3g to the control IC 10 to be converted into LIN signals whose voltage levels are enterable into the microcomputer 80 by the control IC 10. The converted LIN signals are entered into the microcomputer 80. The microcomputer 80 generates the control signals for drive of the load drive circuit 90 in accordance with instructions included in the LIN signals to output them to the control IC 10. The control IC 10 controls the load drive circuit 90 based on the outputted control signals so that the load drive circuit 90 drives the motor 100 based on the control of the control IC 10.

Figure 2:
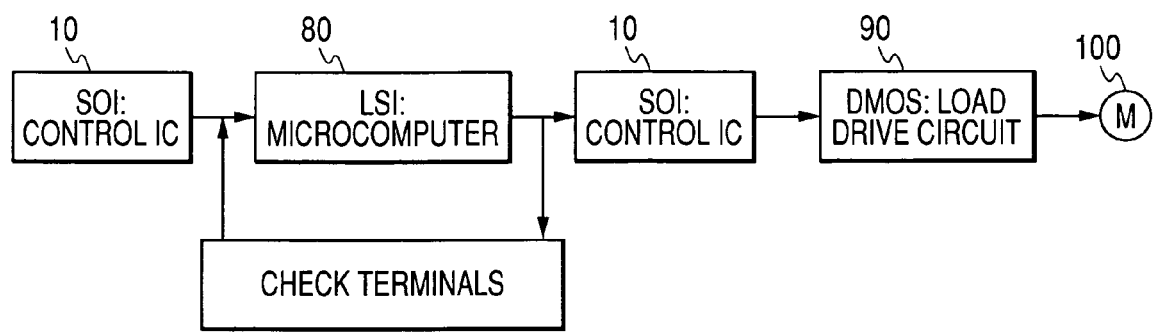
FIG. 2 is a schematic block diagram illustrating a flow of a LIN signal according to the first embodiment.

As illustrated in FIG. 2, the signals for check are inputted to the microcomputer 80 from some of the check terminals, and the signals for check are outputted from the microcomputer 80 to some of the check terminals.

An example of connection relationships between the blocks illustrated in FIG. 2 is configured as follows.

(1) Connection Relationship Between the Input Terminals and the Control IC 10

The LIN signal input/output terminal 3g is connected to at least one of the pads made of Al of the control IC 10 through a bonding wire made of Au, the conductor pattern made of Cu and mounted on the multilayer substrate 2a, and a bonding wire made of Au.

(2) Connection Relationship from the Control IC 10 to the Microcomputer 80

At least one of the pads of the control IC 10 is connected to at least one of the pads of the microcomputer 80 through a bonding wire made of Au, the conductor pattern on the multilayer substrate 2a, and a bonding wire made of Au.

(3) Connection Relationship from the Microcomputer 80 to the Control IC 10

At least one of the pads of the microcomputer 80 is connected to at least one of the pads of the control IC 10 through a bonding wire made of Au, the conductor pattern on the multilayer substrate 2a, and a bonding wire made of Au.

(4) Connection Relationship Between the Control IC 10 and the Power Transistors 91 to 94

The pads of the control IC 10 are connected to gates made of Al of the power switching elements through bonding wires made of Au, the conductor pattern on the multilayer board 2a, bonding wires made of Au, and the conductor pattern, made of Ag, on the single layer board 2b, respectively.

(5) Connection Relationship Between the Power Transistors 91 to 94 and the Motor Connection Terminals 4b and 4d of the Output Terminals Pads, made of Al, of the sources of the power transistors 91 to 94 are connected to the motor connection terminals 4b and 4d made of Cu through bonding wires made of Al, respectively.

Pads, made of nickel (Ni), of the drains of the power transistors 91 to 94 are connected to the motor connection terminals 4b and 4d made of Cu through the conductor pattern on the single layer board 2b.

(6) Connection Relationship Between the Microcomputer 80 and the Check Terminals The pads of the microcomputer 80 is connected to the check terminals 5a to 5m and 6a to 6m, made of Cu, through the conductor pattern on the multilayer board 2a and bonding wires, respectively.

As described above, the lead terminals 3a to 3h, 4a to 4h, 5a to 5m, 6a to 6m, the control IC 10, the microcomputer 80, and the load drive circuit 90 are electrically connected to one another through the conductor patterns on the boards 2a and 2b and/or the bonding wires. Incidentally, the bonding wires made of Al are used for connecting paths between some of the elements (3a to 3h, 4a to 4h, 5a to 5m, 6a to 6m, 10, 80, and 90) through which comparatively high current flows. In contrast, the bonding wires made of Au are used for connecting paths between some of the elements (3a to 3h, 4a to 4h, 5a to 5m, 6a to 6m, 10, 80, and 90) through which comparatively low current of, for example, approximately several hundred milliampere, flows.

Figure 3:
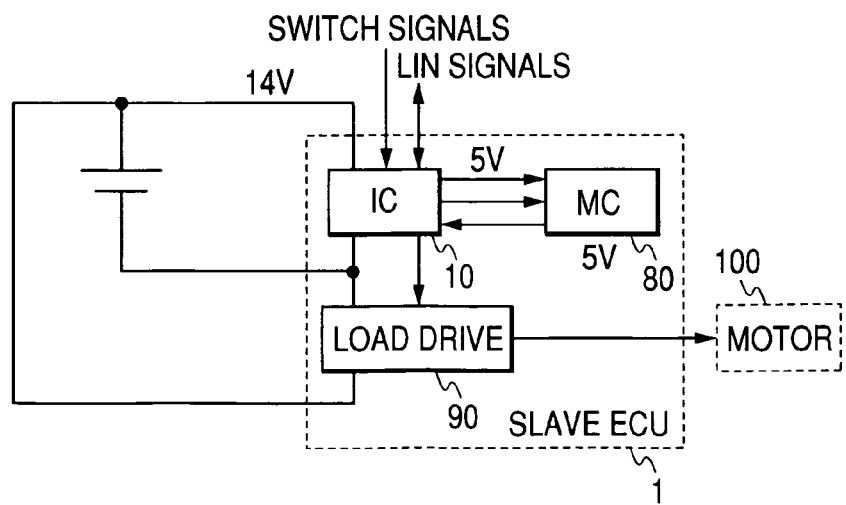
FIG. 3 is a schematic block diagram illustrating the block structure of the overall door ECU illustrated in FIG. 1.

FIG. 3 illustrates the block structure of the overall door ECU 1. The door ECU 1 is provided with the control IC 10, the microcomputer (MC) 80 connected thereto, and the load drive circuit (LOAD DRIVE) 90 connected to the control IC 10, which have been described above. A DC voltage (battery voltage) of, for example, approximately 14 V is applied from the battery of the vehicle through an accessory switch thereof.

The LIN signals and the switch signals are inputted from the exterior of the ECU 1 thereinto through the input terminals. The voltage levels of the LIN signals and those of the switch signals are set to any one of 0 V and 14 V. The control IC 10 is operative to convert the LIN signals and the switch signals inputted from the exterior of the ECU 1 into LIN signals and switch signals whose levels are enterable into the microcomputer 80, such as 5 V, thereby outputting the converted LIN signals and switch signals to the microcomputer 80. In addition, the control IC 10 is operative to receive LIN signals subjected to predetermined operations by the microcomputer 80 and inputted therefrom, and to convert the received LIN signals into LIN signals whose voltage levels are predetermined voltage levels corresponding to the LIN protocol, thereby outputting the converted LIN signals to the exterior of the ECU 1. In addition, the control IC 10 is operative to control the load drive circuit 90 based on the control signals outputted from the microcomputer 80.

The microcomputer 80 includes a ROM, a RAM, and an I/O circuit and operative to execute various operations based on programs stored in the ROM. Specifically, the microcomputer 80 generates the control signals for drive of the load drive circuit 90 in accordance with instructions included in the LIN signals and the switch signals sent from the control IC 10. The microcomputer 80 outputs the generated control signals to the control IC 10. In addition, the microcomputer 80 is configured to operate in any one of an active mode and a low current drain mode, and to output, to the control IC 10, a switching signal indicative of whether the microcomputer 80 operates in the active mode or the low current drain mode.

The active mode is a mode in which the microcomputer 80 operates with a normal current drain in response to the signals inputted from the exterior of the ECU 1. The low current drain mode is a mode in which the microcomputer 80 is, for example, on standby such that it operates with a low current drain in cases where no signal haven been inputted from the exterior of the ECU 1 for a predetermined period of time in the active mode. For example, the microcomputer 80 shifts to the low current drain mode when an ignition switch is turned off.

Note that the microcomputer 80 runs at an operating voltage of, for example, 3 V thereinside for low power consumption.

In the structure of the door ECU 1, when the LIN signal or the switch signal is inputted from the exterior of the ECU 1, for example, from the master ECU, into the microcomputer 80 through the control IC 10, the microcomputer 80 receives the LIN signal or the switch signal. Subsequently, the microcomputer 80 generates the control signals for drive of the load drive circuit 90 based on an instruction included in the LIN signal or the switch signal. The control IC 10 controls the load drive circuit 90 based on the control signals outputted from the microcomputer 80. The load drive circuit 90 drives the motor 100 based on the control of the control IC 10.

Next, an example of the circuit structure of the control IC 10 and that of the operations of the control IC 10 will be described with reference to FIG. 4.

The control IC 10 is a mixed integrated circuit (mixed IC) in which analog and digital circuits are embedded.

Specifically, the control IC 10 is provided with the power supply module PM having an active-mode power supply circuit 20 and a low current drain-mode power supply circuit 30. The active-mode power supply circuit 20 and the low current drain-mode power supply circuit 30 are connected to each other at a common output terminal "a" connected to the microcomputer 80 through a power supply line (5 V power supply line) PL1.

The control IC 10 is provided with a receive buffer 40 connected to the power supply line PL1 and operative to convert the voltage levels of the switch signals, and a bidirectional buffer 50 connected to the power supply line PL1 and operative to convert the voltage levels of the LIN signals. The control IC 10 is provided with a control circuit 70a connected to the microcomputer 80, and a drive circuit 70b connected thereto.

Incidentally, the active-mode power supply circuit 20 is referred to simply as "first power supply circuit 20" hereinafter, and the low current drain-mode power supply circuit 30 is referred to simply as "second power supply circuit 30" hereinafter.

Figure 4:
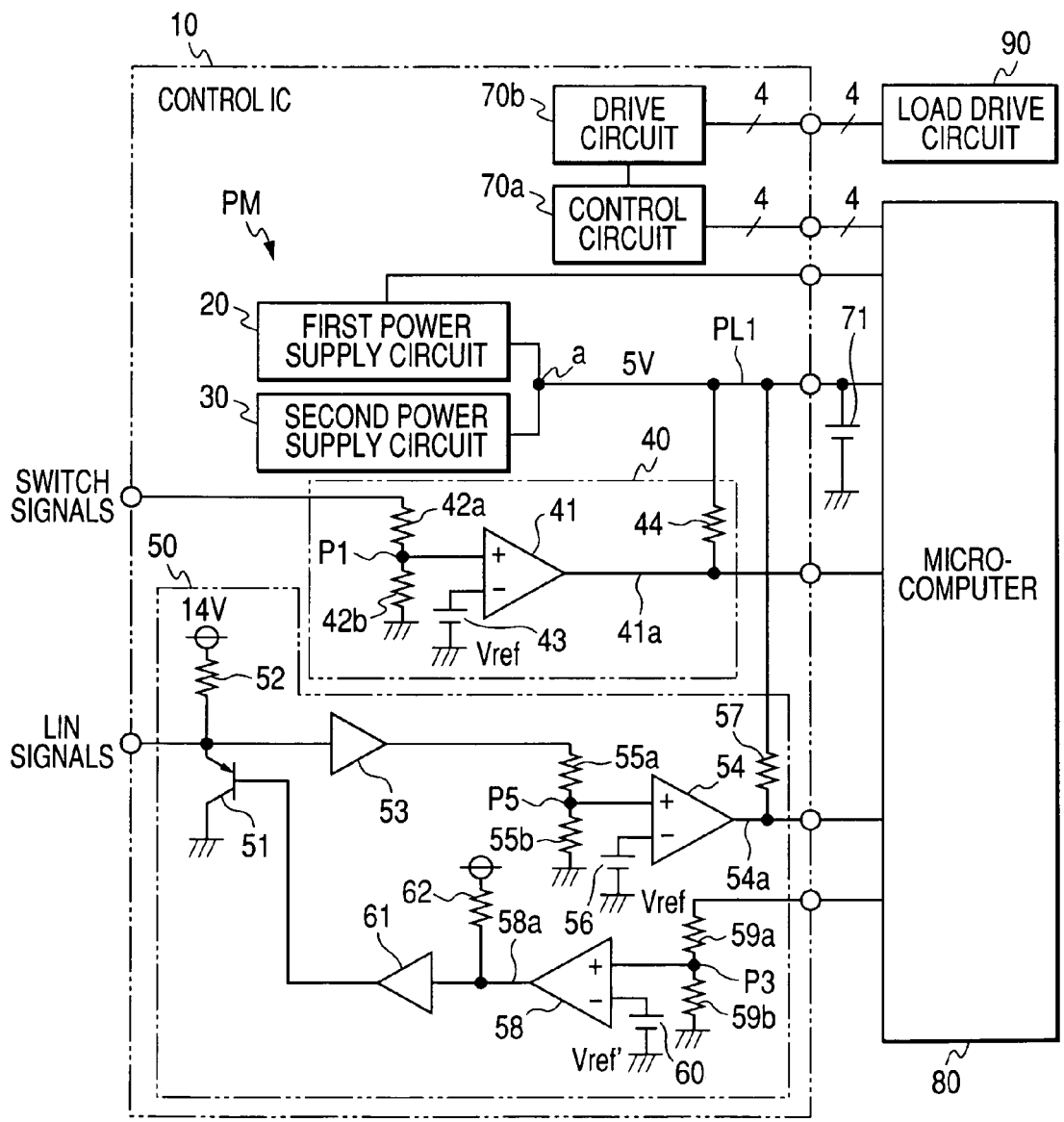
FIG. 4 is a schematic block diagram illustrating an example of the circuit structure of a control IC illustrated in FIG. 1.

Note that FIG. 4 illustrates only one receive buffer 40 in order to simplify the illustration of FIG. 4. Actually, a plurality of, such as five, receive buffers are provided in the control IC 10. The five receive buffers are configured to receive the switch signals in response to: the shift of the power-window switch to the predetermined up position, the shift of the power-window switch to the predetermined down position, the automatic down operation, the automatic up operation, and the engine-key operation. In addition, the five receive buffers are configured to convert the voltage levels of the switch signals into predetermined levels, such as 5V, thereby outputting the converted switch signals to the microcomputer 80, respectively.

The first power supply circuit 20 and the second power supply circuit 30 are configured to generate first and second DC constant voltages based on the DC voltage of, for example, 14 V applied from the battery of the vehicle. The first power supply circuit 20 is configured to output the first constant voltage with comparatively low-temperature dependence while the microcomputer 80 operates in the active mode.

The second power supply circuit 30 is composed of a power supply with the use of a Zener diode that allows a comparatively simple circuit structure to provide the second constant voltage with low current drain. Specifically, the second power supply circuit 30 is configured to output the second constant voltage with predetermined current drain lower than that of the first power supply circuit 20 while the microcomputer 80 operates in the low current drain mode.

Figure 5:
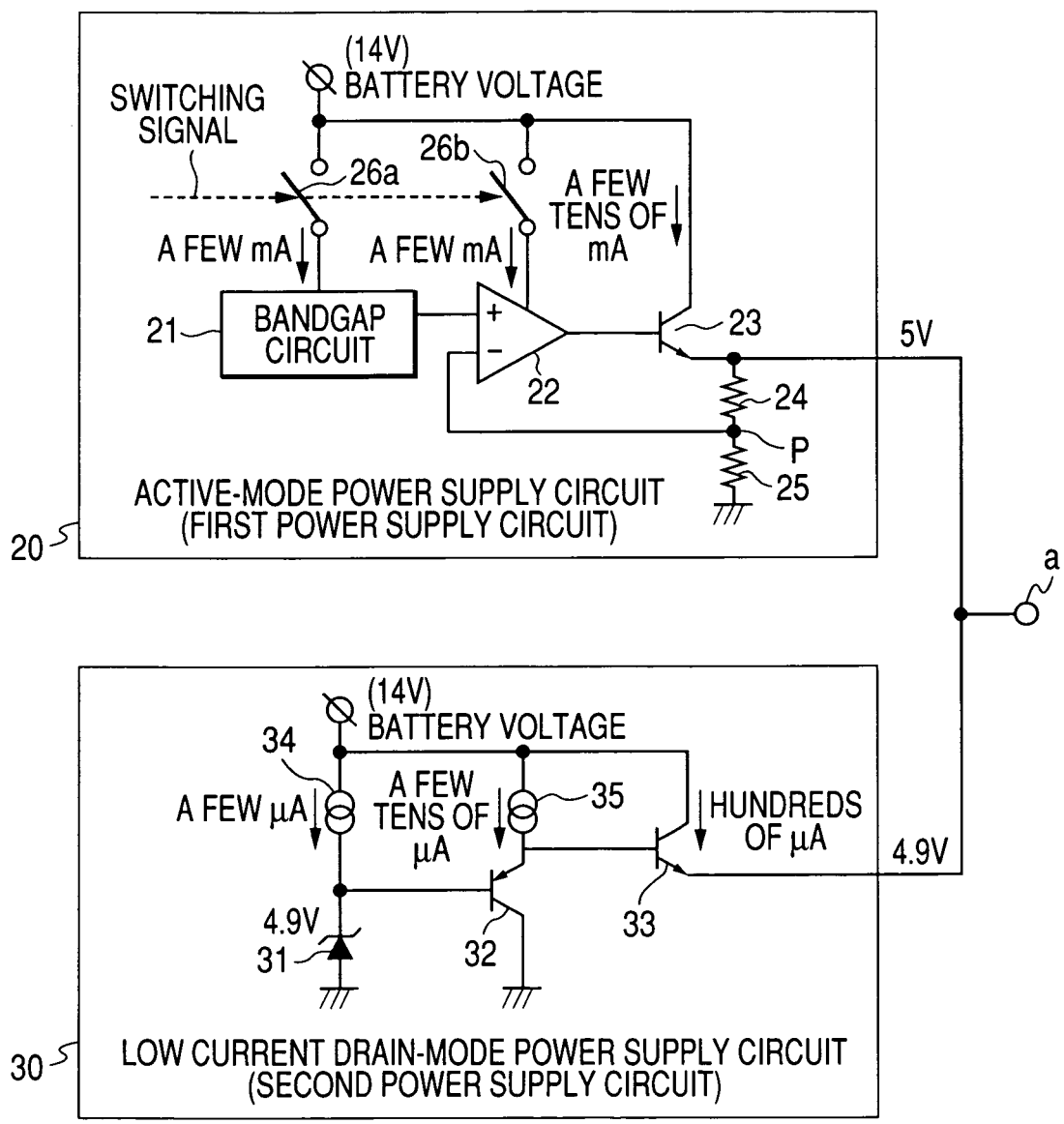
FIG. 5 is a schematic block diagram illustrating the circuit structures of first and second power supply circuits illustrated in FIG. 4.

FIG. 5 illustrates the circuit Structures of the first and second power supply circuits 20 and 30.

The first power supply circuit 20 is provided with a band gap circuit 21 for output of a band-gap reference voltage with low temperature dependence, and an operational amplifier 22 whose noninverting input terminal (+) is connected to the band gap circuit 21. The first power supply circuit 20 is provided with an NPN transistor 23 disposed at the output stage of the operational amplifier 22. The operational amplifier 22 is configured to control a base voltage of the NPN transistor 23 based on the band-gap reference voltage inputted to the noninverting input terminal.

In addition, the first power supply circuit 20 is provided with resistors 24 and 25 connected to each other at a connection point P in series. The resistor 24 is connected to the emitter of the NPN transistor 23, and the resistor 25 is connected to the ground (ground terminal). The inverting input terminal (−) of the operational amplifier 22 is connected to the connection point P of the resistors 24 and 25. The resistors 24 and 25 provide a voltage dividing circuit, Moreover, the first power supply circuit 20 is provided with first and second switching circuits 26a and 26b.

The first switching circuit 26a is connected between a battery-voltage supply line of the battery and the band gap circuit 21, and is operative to open and close based on the switch signal sent from the microcomputer 80. The second switching circuit 26b is connected between the battery-voltage supply line of the battery and the positive power supply terminal of the operational amplifier 22, and is operative to open and close based on the switch signal sent from the microcomputer 80.

Specifically, when the switching signal indicative of the active mode is inputted to the first switching circuit 26a from the microcomputer 80, the first switching circuit 26a closes to allow the battery voltage (14 V) to be applied to the band gap circuit 21. Similarly, when the switching signal indicative of the low current drain mode is inputted to the second switching circuit 26b from the microcomputer 80, the second switching circuit 26b closes to allow the battery voltage (14 V) to be applied to the positive power supply terminal of the operational amplifier 22.

To the noninverting input terminal of the operational amplifier 22, the band-gap reference voltage of, for example, approximately 1.2 V outputted from the band gap circuit 21 is applied. To the inverting input terminal of the operational amplifier 22, a voltage obtained by dividing an emitter voltage of the NPN transistor 23 based on the ratio of the resistances R1 and R2 of the resistors 24 and 25 is applied.

The operational amplifier 22 operates to match the band-gap reference voltage with the divided voltage obtained by the resistors 24 and 25. This operation of the operational amplifier 22 allows a voltage at the connection point P between the resistors 24 and 25 to coincide with the band-gap reference voltage outputted from the band gap circuit 21, making it possible to establish the following equations:

$$V_{rbp} = \frac{R2}{R1 + R2} V_{emit}$$

$$V_{emit} = \frac{R1 + R2}{R2} V_{rbp}$$

where $V_{rbp}$ is the band gap reference voltage, and $V_{emit}$ is the emitter voltage of the NPN transistor 23.

Because the emitter voltage $V_{emit}$ is determined independently of a base-emitter voltage $V_{BE}$ that depends on temperatures and/or a base current, determining the resistances R1 and R2 of the resistors 24 and 25 allows the emitter voltage (output voltage) outputted from the emitter to be set to stable high-accuracy voltage of 5 V.

In addition, the second power supply circuit 30 is provided with a Zener diode 31 with a predetermined Zener breakdown voltage, constant current circuits 34 and 35 for supplying constant currents, respectively, a PNP transistor 32, and an NPN transistor 33 disposed at the output stage of the second power supply circuit 30.

The base of the PNP transistor 32 is connected to the cathode of the Zener diode 31, the cathode thereof is connected to the constant current circuit 34, and the anode of the Zener diode 31 is connected to the ground. The base of the PNP transistor 32 is applied to the Zener breakdown voltage of, for example, 4.9 V. The emitter of the PNP transistor 32 is connected to the constant current circuit 35, and the collector thereof is connected to the ground. The emitter of the PNP transistor 32 is connected to the base of the NPN transistor 33.

The PNP transistor 32 is operative to shift the level of Zener breakdown voltage by a base-emitter voltage $V_{BE}$ thereof so that a potential of the emitter goes higher than the Zener breakdown voltage of the Zener diode 31 by approximately 0.7 V corresponding to the base-emitter voltage $V_{BE}$. A potential of the emitter of the NPN transistor 33 goes lower than that of the base thereof by a base-emitter voltage $V_{BE}$ of the NPN transistor 33. The potential of the emitter of the NPN transistor 33 becomes 4.9 V so that the voltage of 4.9 V, which is equal to the Zener breakdown voltage of the Zener diode 31, is outputted from the emitter of the NPN transistor 33.

Note that, in the first power supply circuit 20, for example, the current flowing through the band gap circuit 21 is set to a few mA, the current flowing through the operational amplifier 22 is set to a few mA, and the current flowing through the NPN transistor 23 is set to a few tens of mA. The few tens of mA are approximately higher than the current drain of the microcomputer 80 operating in the active mode.

In addition, note that, in the second power supply circuit 30, for example, the current flowing through the constant current circuit 34 is set to a few μA, the current flowing through the constant current circuit 35 is set to a few tens of μA, and the current flowing through the NPN transistor 33 is set to hundreds μA. The hundreds μA are approximately higher than the current drain of the microcomputer 80 operating in the low current drain mode.

The second power supply circuit 30 supplies the constant voltage of 4.9 V with current drain sufficiently lower than that of the first power supply circuit 20. This allows dark currents to decrease while the microcomputer 80 operates in the low current drain mode.

In the structure illustrated in FIG. 5, when the switching signal indicative of the low current drain mode is inputted from the microcomputer 80 into the first power supply circuit 20, the first and second switching circuits 26a and 26b open to interrupt supply of the battery voltage to the band gap circuit 21 and the operational amplifier 22, respectively. This allows the constant voltage from the first power supply circuit 20 not to be outputted.

As a result, the potential of the base of the PNP transistor 32 becomes 4.9 V, and the potential of the emitter thereof becomes 5.6 V, allowing the NPN transistor 33 to turn on. The on state of the NPN transistor 33 permits the potential of the emitter thereof to become 4.9 V so that the voltage of 4.9 V, which is equal to the Zener breakdown voltage of the Zener diode 31, is outputted from the emitter of the NPN transistor 33. The outputted voltage of 4.9 V from the NPN transistor 33 allows the voltage at the output terminal "a" to become 4.9 V.

In contrast, when the switching signal indicative of the active mode is inputted from the microcomputer 80 into the first power supply circuit 20, the first and second switching circuits 26a and 26b are closed. This allows the battery voltage to be applied to the band gap circuit 21 and the operational amplifier 22, respectively.

This makes it possible to output the constant voltage of 5.0 V from the first power supply circuit 20 so that the outputted voltage of 5.0 V from the NPN transistor 23 allows the voltage at the output terminal "a" to become 5.0 V.

At that time, the potential of the emitter of the NPN transistor 33 of the second power supply circuit 30 increases by 0.1 V to become 5.0 V so that the base-emitter voltage of the NPN transistor 33 decreases to 0.6 V.

This allows the NPN transistor 33 to be automatically turned off, As described above, in the first embodiment, the constant voltage of 5.0 V or that of 4.9 V is outputted from the first power supply circuit 20 or the second power supply circuit 30 through the output terminal "a" in response to the switch signal outputted from the microcomputer 80.

Note that a capacitor 71 is provided between the output terminal "a" and the ground; this capacitor 71 is operative to reduce the high switching noises transferred from the motor 100 when the rotation direction of the motor 100 is changed.

Next, an example of the circuit structure of the receive buffer 40 will be described with reference to FIG. 4. The receive buffer 40 is provided with a comparator 41, a resistor 42a, and a resistor 42b connected to the resistor 42a at a connection point P1 in series. The resistor 42a is connected to, for example, corresponding one of the switching signal terminals of the input terminals, and the resistor 42b is connected to the ground. The receive buffer 40 is provided with a reference supply 43.

The noninverting terminal (+) of the comparator 41 is connected to the connection point P1, and the inverting input terminal (−) of the comparator 41 is connected to the positive terminal of the reference supply 43, and the negative terminal thereof is connected to the ground. The output terminal 41a of the comparator 41 is connected to the power supply line PL1 through a resistor 44.

In the receive buffer 40, a voltage obtained by dividing a voltage of the switch signal, which is inputted from the corresponding switching signal terminal or the check terminal, based on the ratio of resistances R3 and R4 of the resistors 42a and 42b is applied to the noninverting terminal of the comparator 41. To the inverting input terminal thereof, a reference voltage Vref of, for example, 2.5 V, of the reference supply 43 is applied.

The comparator 41 compares the divided voltage inputted to the noninverting terminal with the reference voltage inputted to the inverting terminal. When determining that the divided voltage inputted to the noninverting terminal is higher than the reference voltage inputted to the inverting terminal, the comparator 41 outputs a voltage of 5 V through the output terminal 41a.

When determining that the divided voltage inputted to the noninverting terminal is lower than the reference voltage inputted to the inverting terminal, the comparator 41 outputs a voltage of 0 V through the output terminal 41*a*.

Specifically, as similar to the first power supply circuit 20, determining the resistances R3 and R4 of the resistors 42*a* and 42*b* allows the voltage inputted to the noninverting terminal of the comparator 41 to be set to stable high-accuracy voltage of 5 V when the switch signal with a high voltage level of, for example, 14 V.

That is, when the switch signal with the high voltage level of 14 V is inputted to the noninverting terminal of the comparator 41, the comparator 41 outputs the voltage of 5 V through the output terminal 41*a*. In contrast, when the switch signal with a low voltage level of, for example, 0 V is inputted to the inverting terminal of the comparator 41, the comparator 41 outputs the voltage of 0 V through the output terminal 41*a*. The high level and the low level are recognizable (processable) by the microcomputer 80.

As described above, the receive buffer 40 is configured to convert the voltage level of the switch signal inputted thereto into the high voltage level or the low voltage level, thereby outputting the high voltage level signal or the low voltage level signal to the microcomputer 80.

Next, an example of the circuit structure of the bidirectional buffer 50 and that of the operations of the bidirectional buffer 50 will be described hereinafter with reference to FIG. 4.

The bidirectional buffer 50 is provided with a PNP transistor 51 and a resistor 52 connected at its one end to the battery-voltage supply line of the battery and its other end to the emitter of the PNP transistor 51.

The bidirectional buffer 50 is provided with a buffer 53 whose input terminal is connected to the emitter of the PNP transistor 51 and to, for example, the LIN signal input/output terminal 3*g*. The bidirectional buffer 50 is provided with a comparator 54, a resistor 55*a*, and a resistor 55*b* connected to the resistor 55*a* at a connection point P2 in series. The bidirectional buffer 50 is provided with a reference supply 56.

The noninverting terminal (+) of the comparator 54 is connected to the connection point P2, and the inverting input terminal (−) of the comparator 54 is connected to the positive terminal of the reference supply 56, and the negative terminal thereof is connected to the ground. The output terminal 54*a* of the comparator 54 is connected to the power supply line PL1 through a resistor 57.

In addition, the bidirectional buffer 50 is provided with a comparator 58, a resistor 59*a*, and a resistor 59*b* connected to the resistor 59*a* at a connection point P3 in series. The resistor 59*a* is connected to the microcomputer 80, and the resistor 59*b* is connected to the ground. The bidirectional buffer 50 is provided with a reference supply 60.

The noninverting terminal (+) of the comparator 58 is connected to the connection point P3, and the inverting input terminal (−) of the comparator 58 is connected to the positive terminal of the reference supply 60, and the negative terminal thereof is connected to the ground.

The bidirectional buffer 50 is provided with a buffer 61 whose input terminal is connected to the output terminal 58*a* of the comparator 58, and a resistor 62 connected at its one end to the output terminal 58*a* of the comparator 58 and its other end to the battery-voltage supply line of the battery. The output terminal of the buffer 61 is connected to the base of the PNP transistor 51.

The buffers 53 and 61 serve as impedance-converting circuits, respectively.

The circuit composed of the comparator 54, the reference supply 56, and the resistors 55*a*, 55*b*, and 57 is configured to execute converting operation of the voltage level of the LIN signal, which is similar to the receive buffer 40, Specifically, the circuit is configured to convert the voltage level of the LIN signal inputted from the LIN signal input/output terminal 3*g* into the high voltage level of 5 V or the low voltage level of 0 V, which are recognizable and processable by the microcomputer 80. The circuit is configured to output the signal with the high voltage level or the low voltage level to the microcomputer 80.

The circuit composed of the comparator 58, the reference supply 60, and the resistors 59*a*, 59*b*, and 62 is configured to execute converting operation of the voltage level of a signal sent from the microcomputer 80.

Specifically, the circuit is configured to convert the voltage level (low level of 0V and high level of 5V) of the signal inputted from the microcomputer 80 into the voltage level of the LIN signal (0V or 14V).

The LIN signal corresponding to the voltage outputted from the buffer 61 is outputted to the exterior of the ECU 1 from the emitter of the PNP transistor 51.

On the other hand, to the control circuit 70*a*, the control signal sent from the microcomputer 80 and the motor resolution information outputted from the Hall sensor are inputted. The control circuit 70*a* outputs the control signal to the drive circuit 70*b*, and when determining that the rotation of the motor 100 is stopped, outputs a signal to forcibly stop the drive of the motor 100 to the drive circuit 70*b*.

The drive circuit 70*b* individually outputs the control signals to the gates of the power transistors 91 to 94 based on the control signal outputted from the control circuit 70*a*.

Next, an example of the circuit structure of the load drive circuit 90 and that of the operations thereof will be described hereinafter with reference to FIGS. 6 and 7.

Figures 6, 7:
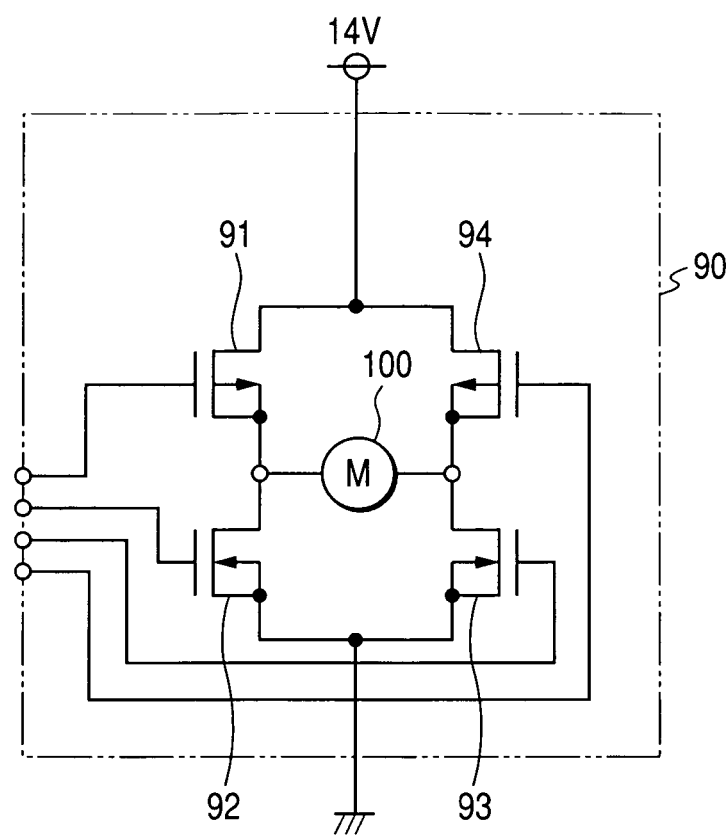
FIG. 6 is a schematic block diagram illustrating an example of the circuit structure of a load drive circuit and that of the operations of the load drive circuit illustrated in FIG. 1.
FIG. 7 is a view illustrating relationships between the operation state of a motor illustrated in FIG. 1 and on/off states of four power transistors of a load drive circuit illustrated in FIG. 1.

As illustrated in FIG. 6, the load drive circuit 90 is provided with the power transistors 91 to 94.

The power transistors 91 to 94 constitute a full H-bridge circuit, and operate to drive the motor 100 so as to roll up the window glass and roll down it. The on/off states of the power transistors 91 to 94 are changed depending on when the motor 100 is stopped, when the window glass is rolled up, and when the window glass is rolled down.

Specifically, as illustrated in FIG. 7, when the motor 100 is stopped, all of the power transistors 91 to 94 are turned off. While the motor 100 operates to roll up the window glass, a pair of power transistors 91 and 93 arranged on one of diagonal lines of the full H-bridge circuit are kept in on state, and a pair of power transistors 92 and 94 arranged along the other thereof are kept in off state.

While the motor 100 operates to roll down the window glass, the pair of power transistors 91 and 93 arranged on one of the diagonal lines of the full H-bridge circuit are kept in off state, and the pair of power transistors 92 and 94 arranged along the other thereof are kept in on state.

That is, the full H-bridge circuit 90 allows a current flowing through the motor 100 to be alternately inverted, making it possible to alternately reverse the rotation of the motor 100 depending on the switching of the rolling-up of the window glass and the rolling-down thereof.

As described above, in the first embodiment, the check terminals 5*a* to 5*m* and 6*a* to 6*m* are configured to project to extend to the longitudinal side surfaces 8*a*1 and 8*a*2 of the package 8. This structure allows, for example, a check operator to connect a monitoring device through at least one of the check terminals to each of the various terminals and/or various portions of the conducive pattern mounted on the substrates 2a and 2b even after the door ECU 1 has been encapsulated to be packaged by the protective mold material. The door ECU 1 according to the first embodiment, therefore, makes it possible to easily check the elements mounted on the boards 2a and 2b and encapsulated by the package 8, improving check efficiency of the door ECU 1.

In addition, in the first embodiment of the present invention, the check terminals 5a to 5m are parallely disposed on the concave portion 8b1 such that they do not project from an outline OL1 of the portion of the longitudinal side surface 8a1 except for the concave portion 8b1. Similarly, the check terminals 6a to 6m are parallely disposed through the concave portion 8b2 such that they do not project from an outline OL2 of the portion of the longitudinal side surface 8a2 except for the concave portion 8b2. This can prevent the check terminals 5a to 5m and 6a to 6m from contacting to the vicinity of the door ECU 1 that has been installed in the housing of the motor 100, avoiding the possibility of an occurrence of short-circuit between the check terminals and the housing.

Moreover, in the first embodiment, when the microcomputer 80 operates in the low current drain mode, the second power supply circuit 30 supplies the constant voltage of 4.9 V with current drain sufficiently lower than that of the first power supply circuit 20. This allows dark currents to decrease while the microcomputer 80 operates in the low current drain mode.

In other words, when the microcomputer 80 operates in the active mode, the first power supply circuit 20 supplies to the microcomputer 80 the current higher than the current drain of the microcomputer 80. This makes it possible to stably supply the current to the microcomputer 80.

Furthermore, in the first embodiment, because the elements mounted on the boards 2a and 2b are encapsulated to be packaged, it is possible to secure airtightness of the door ECU 1, allowing water or the like to be prevented from entering into the door ECU 1.

Second Embodiment

As an example of electronic units according to a second embodiment of the present invention, a hybrid circuit 101, which is similar to the hybrid circuit composed of the control IC 10 and the microcomputer 80 according to the first embodiment, will be described hereinafter.

Figure 8:
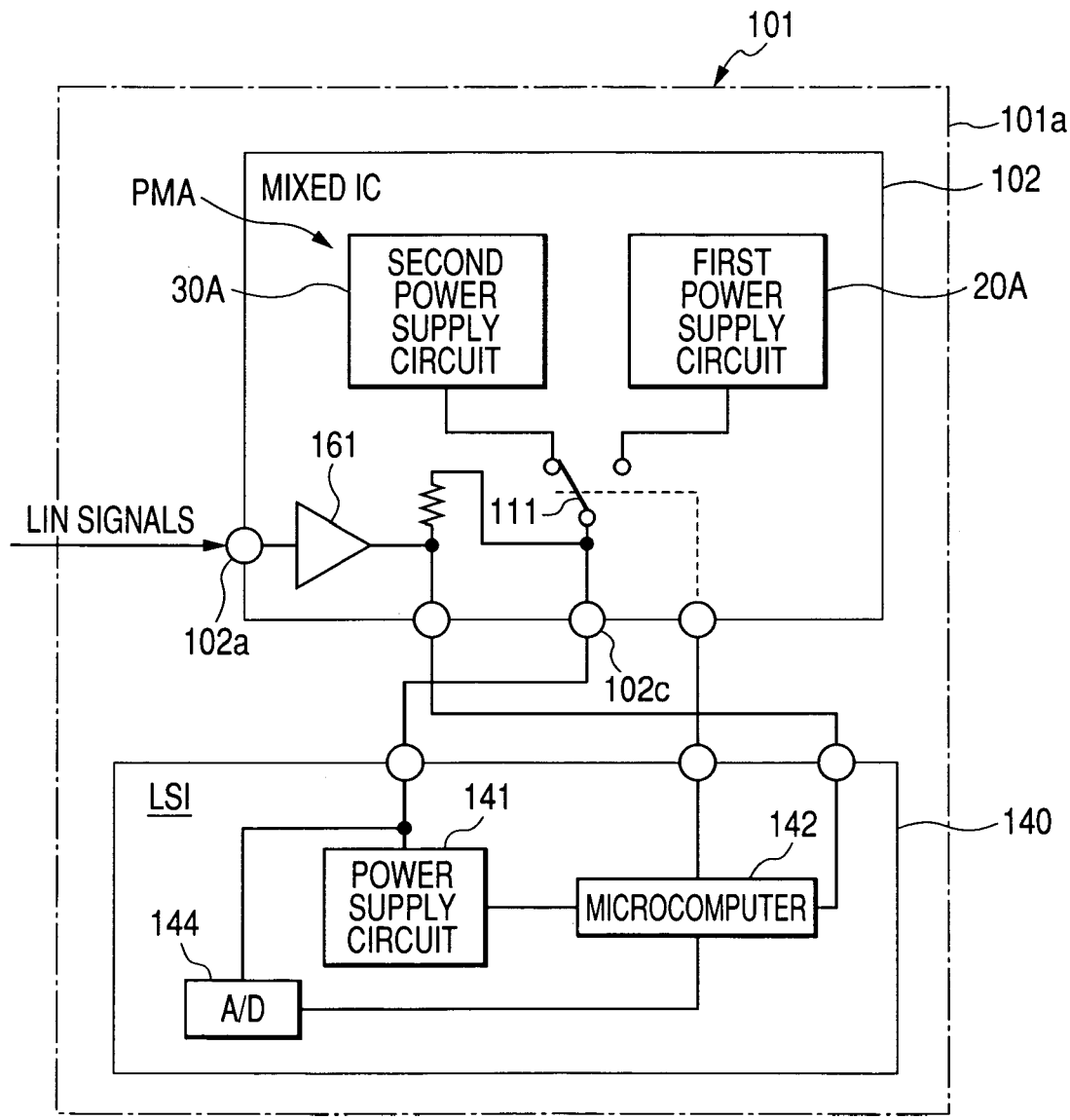
FIG. 8 is a schematic block diagram of a hybrid circuit according to a second embodiment of the present invention.

As illustrated in FIG. 8, the hybrid circuit 101 is provided with the mixed IC 102 having a power supply module PMA similar to the power supply module PM according to the first embodiment, and with a LSI (Large Scale IC) 140, As similar to the first embodiment, the hybrid circuit 101 serves as an ECU for driving and controlling at least one actuator, such as a motor, a solenoid, a lamp driver, or the like.

As similar to the first embodiment, the mixed IC 101 and the LSI 140 are mounted on a same substrate (board), and the mixed IC 101, the LSI 140, and connection elements connecting between the mixed IC 101 and the LSI 140 are encapsulated in a protective mold material to be installed in the mold package, which is a substantially same manner as the first embodiment.

The mixed IC 101 is provided with a LIN communication buffer 161 configured to receive the LIN signals externally sent through a communication bus terminal 102a and to convert the received LIN signals to LIN signals whose voltage levels are processable by the microcomputer 142, thereby sending the converted LIN signals to the microcomputer 142.

In addition, the mixed IC 101 is provided with the power system module PMA and a switching circuit 111. The power system PMA has an active-mode power supply circuit 20A and a low current drain-mode power supply circuit 30A, which are similar to the circuits 20 and 30, respectively.

Specifically, in the second embodiment, the active-mode power supply circuit 20A, referred to as "first power supply circuit" 20A, and the low current drain-mode power supply circuit 30A, referred to as "second power supply circuit" 30A have substantially identical structures of the first power supply circuit 20 and the second power supply circuit 30, which are illustrated in FIG. 5.

One different point between each of the first power supply circuit 20A and the second power supply circuit 30A and each of the first power supply circuit 20 and the second power supply circuit 30 is that a DC voltage (battery voltage) applied to each of the first and second power supply circuits 20A and 30A is 12 V.

In addition, in the second embodiment, the common output terminal "a" according to the first embodiment, is represented as a common output terminal "102c", and the microcomputer 80 according to the first embodiment is represented as the microcomputer 142.

The LSI 140 is provided with a microcomputer 142 with memory in which programs are stored. The LSI 140 is provided with a power supply circuit 141 for microcomputers; this power supply circuit 141 is electrically connected to the microcomputer 142 and the output terminal 102c. The power supply circuit 141 is operative to generate 3 V voltage based on the output voltage of 5 V outputted through the output terminal 2c from the power supply module PMA. The LSI 140 is provided with an analog-to-digital converter (A/D converter) 44 connected to the microcomputer 142 for converting analog signals into digital signals; these analog signals are sent from at least one sensor for sensing operating states of the at least one actuator. The microcomputer 142 is operative to control the at least one actuator using the digital signals converted by the A/D converter 44 in accordance with the programs stored in the memory.

The switching circuit 111 according to the second embodiment is illustrated in FIG. 8 as a distinct element in order to simplify the illustration in FIG. 8. In actuality, the first and second power supply circuits 20A and 30A include constant voltage switching functions therebetween, which have been described in the first embodiment.

Specifically, as illustrated in FIG. 5, when the switching signal indicative of the low current drain mode is inputted from the microcomputer 142 into the first power supply circuit 20A, the first and second switching circuits 26a and 26b open to interrupt supply of the battery voltage (12V) to the band gap circuit 21 and the operational amplifier 22, respectively. This allows the constant voltage from the first power supply circuit 20A not to be outputted.

As a result, as described in the first embodiment, the potential of the base of the PNP transistor 32 becomes 4.9 V, and the potential of the emitter thereof becomes 5.6 V, allowing the NPN transistor 33 to turn on. The on state of the NPN transistor 33 permits the potential of the emitter thereof to become 4.9 V so that the voltage of 4.9 V, which is equal to the Zener breakdown voltage of the Zener diode 31, is outputted from the emitter of the NPN transistor 33.

That is, the output voltage of 4.9 V of the second power supply circuit 30A is selected to be outputted through the output terminal "102c".

In contrast, when the switching signal indicative of the active mode is inputted from the microcomputer 142 into the first power supply circuit 20, the first and second switching circuits 26a and 26b are closed. This allows the battery voltage (12V) to be applied to the band gap circuit 21 and the operational amplifier 22, respectively.

This makes it possible to output the constant voltage of 5.0 V from the first power supply circuit 20A so that the outputted voltage of 5.0 V from the NPN transistor 23 allows the voltage at the output terminal "102c" to become 5.0 V.

At that time, the potential of the emitter of the NPN transistor 33 of the second power supply circuit 30A increases by 0.1 V to become 5.0 V so that the base-emitter voltage of the NPN transistor 33 decreases to 0.6 V. This allows the NPN transistor 33 to be automatically turned off.

That is, the output voltage of 5.0 V of the first power supply circuit 30A is selected to be outputted through the output terminal "102c".

When the output of the voltage from the first power supply circuit 20A is interrupted, the NPN transistor of the second power supply circuit 30B is turned on again, so that the voltage of 4.9 V is outputted from the emitter of the NPN transistor 33 to the output terminal 102c.

Note that, in the second embodiment, the current flowing through the NPN transistor 23 is set to a few tens of mA, and the few tens of mA are approximately higher than the current drain of the LSI 140 in which the microcomputer 142 operates in the active mode.

In addition, note that, in the second embodiment, the current flowing through the NPN transistor 33 is set to hundreds µA, and the hundreds µA are approximately higher than the current drain of the LSI 140 in which the microcomputer 142 operates in the low current drain mode.

As set forth above, in the second embodiment, like the first embodiment, when the microcomputer 142 operates in the low current drain mode, the second power supply circuit 30A supplies the constant voltage of 4.9 V with current drain sufficiently lower than that of the first power supply circuit 20A. This allows dark currents to decrease while the microcomputer 142 operates in the low current drain mode.

In other words, when the microcomputer 142 operates in the active mode, the first power supply circuit 20A supplies to the LSI 140 the current higher than the current drain of the LSI 140. This makes it possible to stably supply the current to the LSI 140.

Furthermore, in the second embodiment, like the first embodiment, the package encapsulating the hybrid circuit 101 allows airtightness of the hybrid circuit 101 to be secured, making it possible to prevent water or the like from entering into the hybrid circuit 101.

Third Embodiment

As an example of electronic units according to a third embodiment of the present invention, similar to the second embodiment, a hybrid circuit 201, which is similar to the hybrid circuit composed of the control IC 10 and the microcomputer 80 according to the first embodiment, will be described hereinafter.

Figure 9:
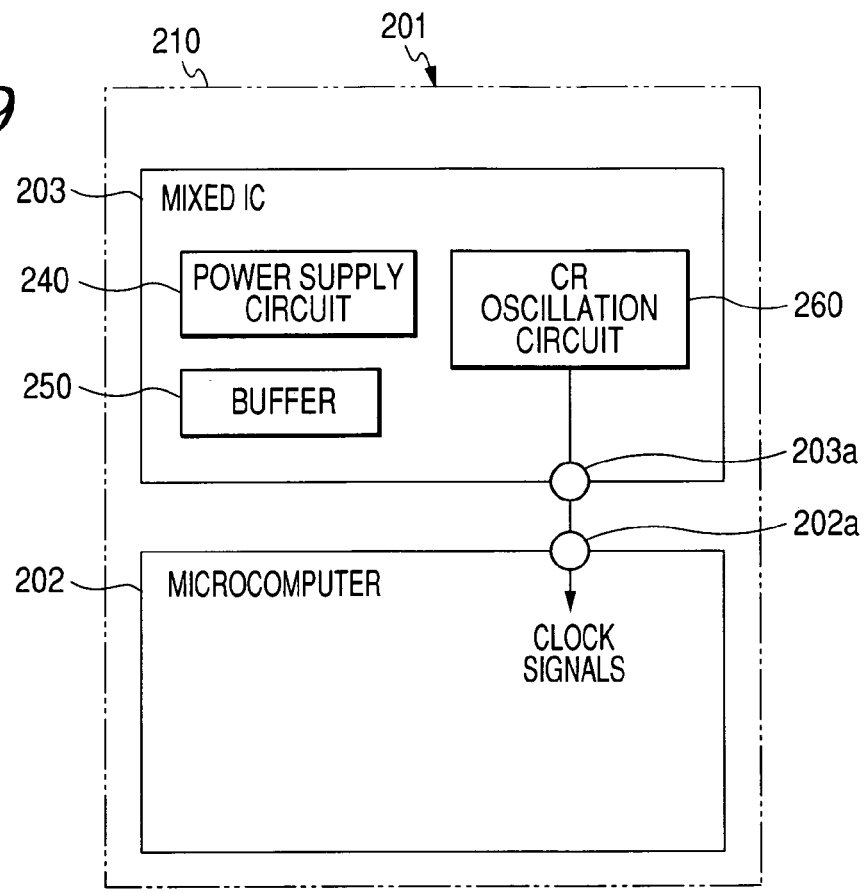
FIG. 9 is a schematic block diagram of a hybrid circuit according to a third embodiment of the present invention.

Specifically, as shown in FIG. 9, the hybrid circuit 201 is provided with a microcomputer 202 as a first integrated circuit and a mixed IC 203 as a second integrated circuit.

The microcomputer 202 and the mixed IC 203 are formed as discrete chips, and the discrete chips 202 and 203 are mounted on a same substrate (board) 210. The microcomputer 202, the mixed IC 203, and connection elements connecting between the microcomputer 202 and the mixed IC 203 are encapsulated in a protective mold material to be installed in a package in a substantially same manner as the first embodiment.

The microcomputer 202 is provided with a clock terminal 202a and is designed to operate based on a clock with a predetermined operation frequency. Specifically, the microcomputer 202 operates to execute various operations in synchronization with the clock with the predetermined operation frequency inputted from the clock terminal 202a. The clock is composed of a repetitive series of pulses (clock pulses), and the clock is fed from a CR oscillation circuit 260 of the mixed IC 203.

The mixed IC 203 is provided with a power supply circuit 240, a buffer 260, and the CR oscillation circuit 260.

The power supply circuit 240 has a substantially identical structure of the first power supply circuit 20. Specifically, the power supply circuit 240 is operative to generate a constant voltage of, for example, 5 V based on a battery voltage supplied from an exterior battery, thereby supplying the generated constant voltage to internal circuits of the mixed IC 203 and the microcomputer 202.

The buffer 250 is operative to receive input signals sent from at least one external device to convert the received signals to signals whose levels are processable by the microcomputer 202, thereby sending the converted signals to the microcomputer 202. In addition, the buffer 250 is operative to output signals, which are sent from the microcomputer 202, to at least one external device.

The CR oscillation circuit 260 is provided with a capacitor 261 and a resistor 262. The CR oscillation circuit 260 is operative to generate the clock with the predetermined frequency (oscillation frequency) based on a time constant predetermined by the capacitance C10 of the capacitor 261 and the resistance RIO of the resistor 262. The CR oscillation circuit 260 is operative to output the generated clock from a clock terminal 203a.

The clock terminal 203a of the mixed IC 203 and the clock terminal 202a of the microcomputer 202 are connected with a conductor trace in a conductor pattern formed on the substrate 210 so that the clock outputted from the CR oscillation circuit 260 is inputted to the clock terminal 202a of the microcomputer 202.

Note that, in the third embodiment, the oscillation frequency of the clock generated by the CR oscillation circuit 260 is set to a value within a range from a few MHz to a few tens of MHz.

Figure 10:
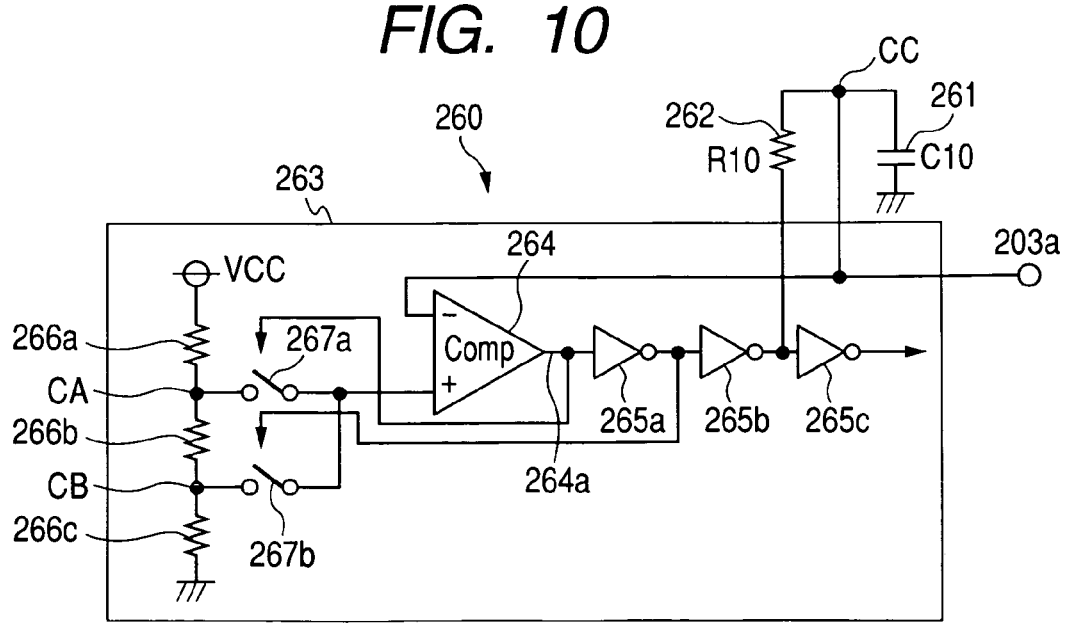
FIG. 10 is a schematic circuit diagram illustrating an example of the circuit structure of a CR oscillation circuit illustrated in FIG. 9.

FIG. 10 illustrates an example of the circuit structure of the CR oscillation circuit 260. The CR oscillation circuit 260 is provided with the capacitor 261, the resistor 262, and a control unit 263. The control unit 263 includes a comparator 264, inverting circuits 265a to 265c, resistors 266a to 266c, and switches 267a and 267b.

The resistors 266a to 266c are connected to each other in series through connection points CA and CB. The resistors 266a to 266c serve as a voltage dividing circuit for dividing a power supply voltage $V_{CC}$.

The noninverting input terminal (+) of the comparator 264 is connected to the connection point CA through the switch 267a, and to the connection point CB through the switch 267b. Turning on of the switch 267a with the switch 267b kept in off state allows the potential at the connection point CA to be applied to the noninverting input terminal of the comparator 264. In contrast, turning on of the switch 267b with the switch 267a kept in off state allows the potential at the connection point CB to be applied to the noninverting input terminal of the comparator 264

To the inverting input terminal (−) of the comparator 264, a potential of a connection point CC at which one end of the resistor 262 and one end of the capacitor 261 are connected is applied.

The comparator 264 is operative to compare the potential at the noninverting input terminal with that at the inverting input terminal. In addition, the comparator 264 is operative to output a voltage with a high level through an output terminal 264a when the compared result represents that the potential at the noninverting input terminal is higher than that at the inverting input terminal. Moreover, the comparator 264 is operative to output a voltage with a low level through the output terminal 264a when the compared result represents that the potential at the inverting input terminal is higher than that at the noninverting input terminal.

The inverter circuits 265a to 265c are connected in series, and the input terminal of the inverter circuit 265a is connected to the output terminal 264a of the comparator 264. The output terminal of the inverter circuit 265b is connected to the other end of the resistor 262, and the other end of the capacitor 261 is connected to the ground.

The switch 267a is configured to turn on when the potential of the output terminal 264a of the comparator 264 becomes the high level, and to turn off when the potential of the output terminal 264a becomes the low level.

The switch 267b is configured to turn on when the potential of an output terminal of the inverting circuit 265a becomes the high level, and to turn off when the potential of the output terminal of the inverting circuit 265a becomes the low level.

In the structure illustrated in FIG. 10, turning on of the switch 267a allows the potential at the connection point CA to be applied to the noninverting input terminal of the comparator 264.

When the potential at the connection point CA is higher than that at the connection point CC, the potential at the output terminal 264a of the comparator 264 becomes the high level. This allows the potential at the input terminal of the inverting circuit 265b to be turned to the low level, and the potential at the output terminal of the inverting circuit 265b to be turned to the high level.

Change of the potential at the output terminal of the inverting circuit 265b from the low level to the high level permits a current to flow from the output terminal of the inverting circuit 265b through the resistor 262 so that the capacitor 261 starts to charge up based on the current. This results in that the potential at the connection point CC between the capacitor 261 and the resistor 262 gradually increases.

When the potential at the connection point CC becomes higher than that at the connection point CA, the potential at the output terminal 264a of the comparator 264 is reversed from the high level to the low level. This allows the potential at the output terminal of the inverting circuit 265a to be inverted from the low level to the high level.

The low level at the output terminal 264a of the comparator 264 and the high level at the output terminal of the inverting circuit 265a allow the switch 267a to be turned off, and the switch 267b to be turned on. This results in that the potential at the connection point CB is applied to the noninverting input terminal of the comparator 264. At that time, the potential at the output terminal of the inverting circuit 265b is turned from the high level to the low level so that the capacitor 261 starts to discharge. This causes the connection point CC between the capacitor 261 and the resistor 262 to gradually decrease.

When the potential at the connection point CC becomes lower than that at the connection point CB, the potential at the output terminal 264a of the comparator 264 is reversed from the low level to the high level. This allows the potential at the output terminal of the inverting circuit 265a to be inverted from the high level to the low level.

The high level at the output terminal 264a of the comparator 264 and the low level at the output terminal of the inverting circuit 265a allow the switch 267a to be turned on, and the switch 267b to be turned off. This results in that the potential at the connection point CA is applied to the noninverting input terminal of the comparator 264. At that time, because the potential at the output terminal of the inverting circuit 265b is turned from the low level to the high level, a current flows from the output terminal of the inverting circuit 265b through the resistor 262 so that the capacitor 261 starts to charge up based on the current This results in that the potential at the connection point CC between the capacitor 261 and the resistor 262 gradually increases.

As described above, the capacitor 261 alternately repeatedly charges up and discharges so that the potential at the connection point CC is alternately repeatedly reversed between the high level and the low level.

The CR oscillation circuit 260 is provided with a waveform generator (not shown), and the waveform generator generates the clock with the predetermined oscillation frequency based on the alternately reversed potentials at the connection point CC.

The oscillation frequency of the clock generated by the CR oscillation circuit 260 is determined based on the time constant predetermined by the capacitance C10 of the capacitor 261 and the resistance R10 of the resistor 262. Specifically, when the time constant is referred to as $\tau$, the time constant $\tau$ is represented as "$\tau = C10 \cdot R10$". The larger the time constant $\tau$ is, the lower the oscillation frequency of the clock generated by the CR oscillation circuit 260 is. In contrast, the smaller the time constant $\tau$ is, the higher the oscillation frequency of the clock generated by the CR oscillation circuit 260 is.

In addition, in the third embodiment, after the capacitor 261 and the resistor 262 have been fabricated on a wafer corresponding to the mixed IC 203, a laser trimming with respect to the resistor 262 is carried out with the resistor 262 being on the wafer.

Figure 11:
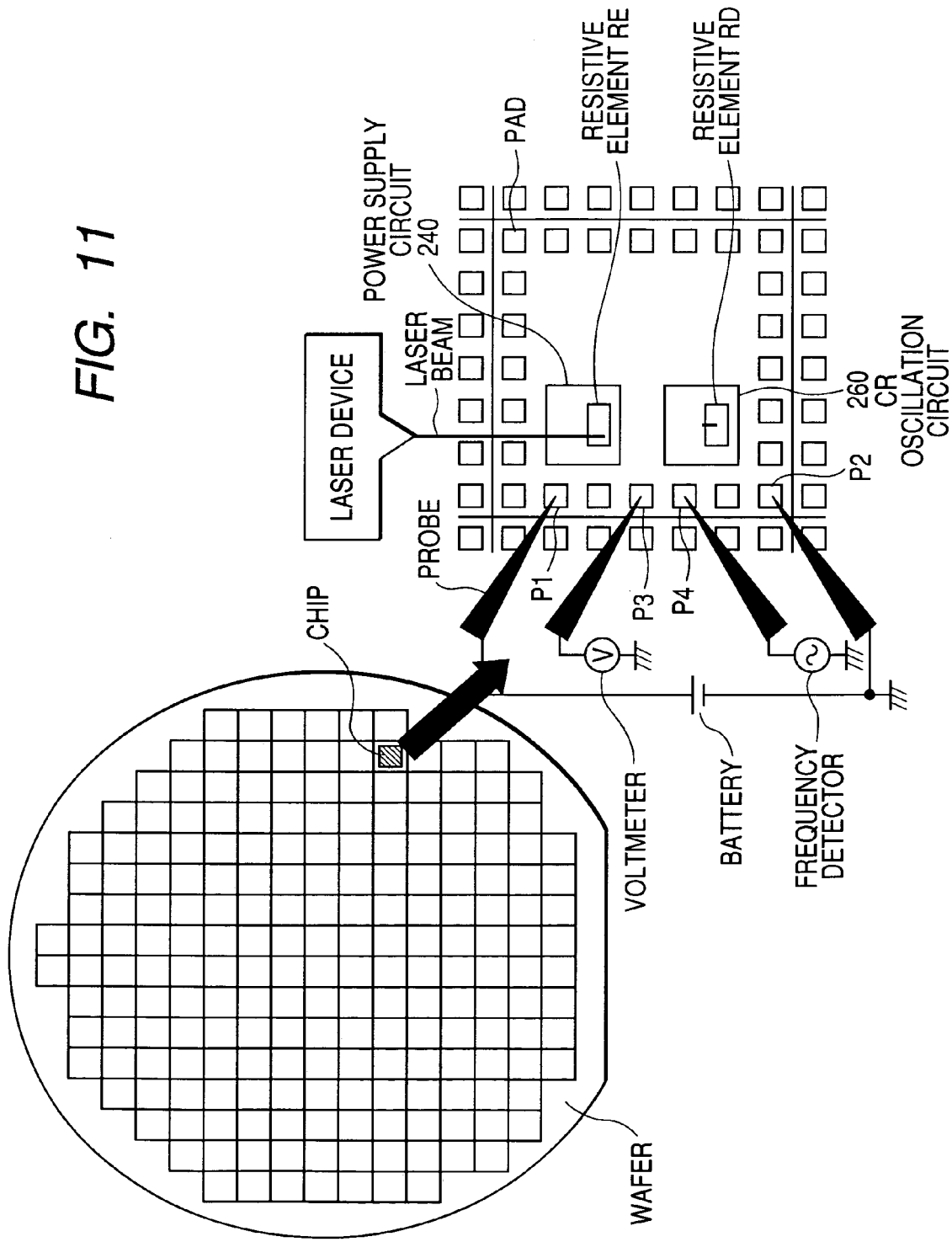
FIG. 11 is a view schematically illustrating how to execute laser trimming according to the third embodiment of the present invention.

Next, the laser trimming according to the third embodiment will be described hereinafter with reference to FIG. 11.

A plurality of chips are fabricated on the wafer, and, on each of the chips, the power supply circuit 240, the CR oscillation circuit 260, and the buffer 250, which constitute the mixed IC 203, are fabricated. Incidentally, in FIG. 11, no buffer is illustrated.

In the CR oscillation circuit 260, a resistive element RD made of, for example, Cr—Si thin film and having, for example, a substantially rectangular shape is formed as the resistor 262, whose resistance requires adjustment for determining the oscillation frequency of the clock generated by the CR oscillation circuit 260.

In the power supply circuit 240, a resistive element RE made of, for example, Cr—Si thin film and having, for example, a substantially rectangular shape is formed, whose resistance requires adjustment for determining the output voltage of the power supply circuit 240.

The resistive elements RD and RE are fabricated on the wafer in the same process.

On each chip, pads have been previously fabricated. For example, the pads includes a pad P1 for supplying power to elements on each chip, a pad P2 for grounding the elements thereon, a pad P3 for monitoring the output voltage of the power supply circuit 240, and a pad P4 for measuring a clock frequency of a clock outputted from the CR oscillation circuit 260.

The pad P1 is connected to each of the power supply circuit 240 and the CR oscillation circuit 260 as the battery-voltage supply line, and the pad P2 is connected to each of the power supply circuit 240 and the CR oscillation circuit 260 as the ground terminal. In addition, the pad P3 is connected to the output terminal of the power supply circuit 240, and the pad P4 is connected to the clock terminal 203a of the CR oscillation circuit 260.

The laser trimming will be carried out as the following procedures.

At first, a voltmeter, a battery, a frequency detector, probes, and a laser device are prepared. The voltmeter is connected to the pad P1 with one of the probes, the frequency detector is connected to the pad P4 with another one of the probes. The positive terminal of the battery is connected to the pad P1 with another one of the probes, and the negative terminal of the battery is connected to the pad P2 with another one of the probes.

Next, a laser beam is irradiated from the laser device to the resistive element RE using a Serpentine-cut method while the output voltage outputted from the power supply circuit 240 and displayed on a screen of the voltmeter is monitored. Heat of the irradiated laser beam onto a part of the resistive element RE melts it to be vaporized so that the resistive element RE is cut (trimmed).

Specifically, the Serpentine cut causes the laser beam to be alternatively irradiated to the original longitudinal sides of the resistive element RE to form a number of laser cuts that alternate in the origination longitudinal sides thereof.

As described above, trimming the resistive element RE to adjust the resistance thereof allows the monitored output voltage to be determined to a desirable voltage.

Subsequently, a laser beam is irradiated from the laser device to the resistive element RD using the Serpentine-cut method while the output voltage outputted from the CR oscillation circuit 260 and displayed on the screen of the voltmeter is monitored. Heat of the irradiated laser beam onto a part of the resistive element RE melts it to be vaporized so that the resistive element RD is cut (trimmed) so that a number of laser cuts that alternate in the origination longitudinal sides of the resistive element RD is formed.

As described above, trimming the resistive element RD to adjust the resistance thereof allows the monitored frequency to be determined to a desirable frequency, such as a predetermined clock frequency of the microcomputer 202.

The laser trimming described above is executed with respect to each of the chips on the wafer.

Specifically, the adjustment of the output voltage of the power supply circuit 240 and that of the oscillation frequency of the signal generated by the CR oscillation circuit 260 are collectively carried out on the wafer every chip.

As described above, in the third embodiment of the present invention, the resistor 262 of the CR oscillation circuit 260 is trimmed by the laser beam so that the oscillation frequency of the signal generated by the CR oscillation circuit 260 becomes the predetermined clock frequency of the microcomputer 202. This allows variations of the resistance of the resistor 262 to be suppressed, making it possible to generate the clock whose frequency corresponds to the clock frequency of the microcomputer 202 with high accuracy. Accordingly, it is possible to integrate the CR oscillation circuit 260 capable of generating the clock with high oscillation accuracy in the hybrid circuit 201.

In addition, because the resistor 262 of the CR oscillation circuit 260 is trimmed by the laser beam with the oscillation frequency being monitored by the frequency detector, it is possible to adjust the oscillation frequency with more high accuracy.

Moreover, like the first and second embodiments, the package encapsulating the hybrid circuit 201 allows airtightness of the hybrid circuit 201 to be secured, making it possible to prevent water or the like from entering into the hybrid circuit 201.

Fourth Embodiment

Figure 12:
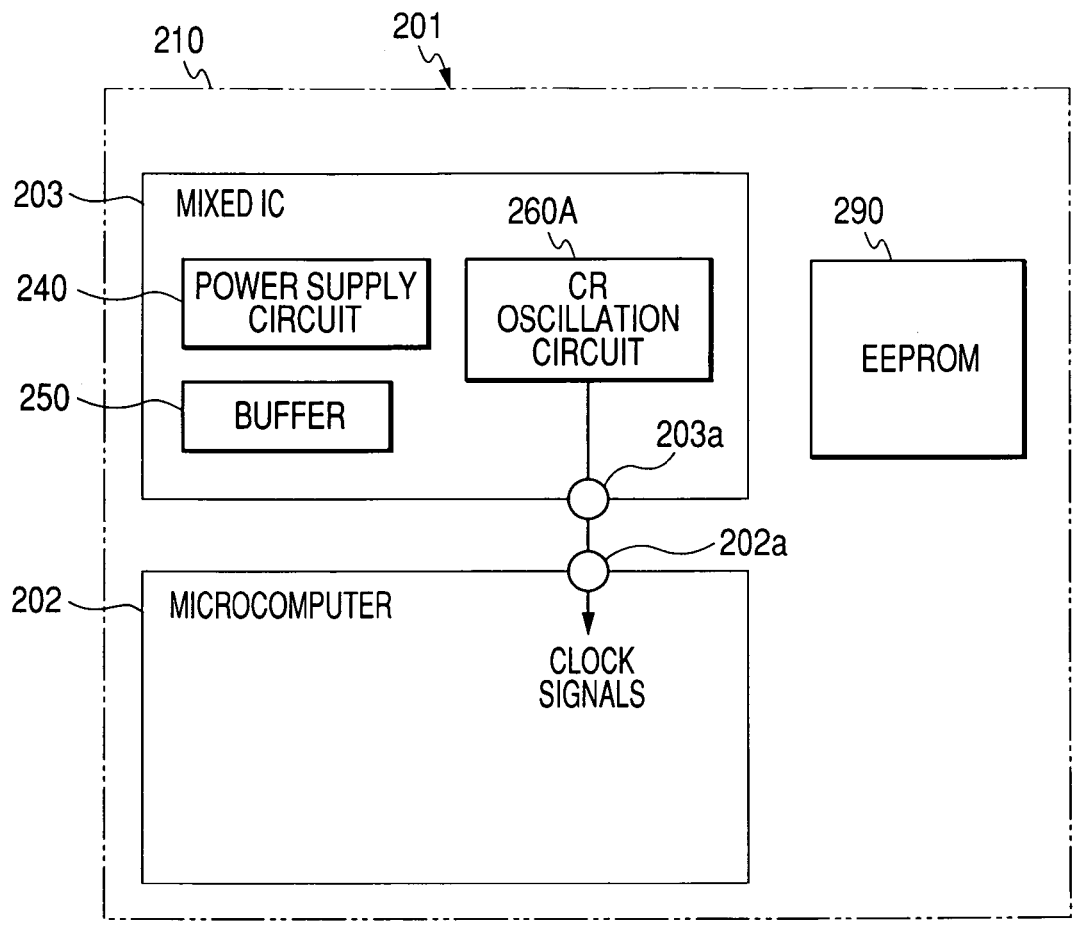
FIG. 12 is a schematic block diagram of a hybrid circuit according to a fourth embodiment of the present invention.
Figure 13:
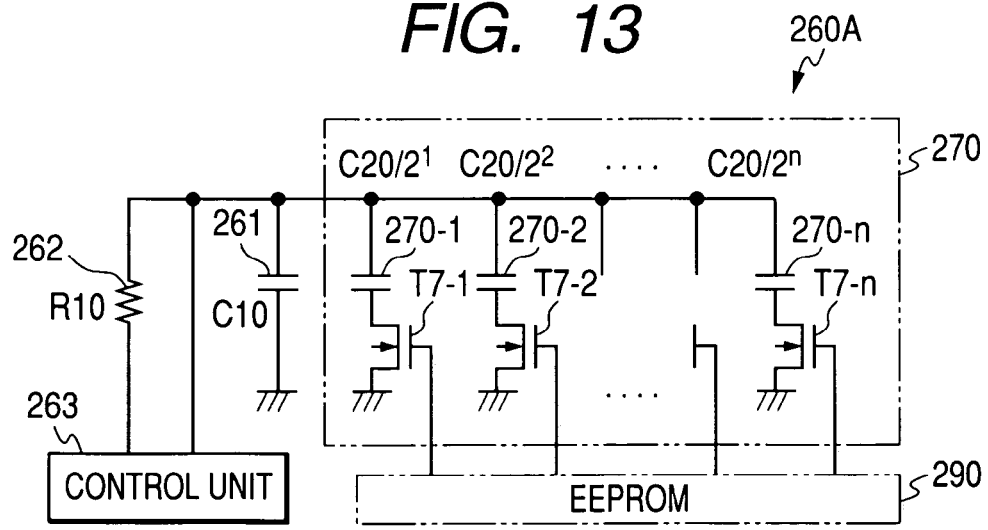
FIG. 13 is a circuit diagram schematically illustrating an example of the circuit structure of the CR oscillation circuit illustrated in FIG. 12.

FIG. 12 illustrates an example of the overall structure of a hybrid circuit 201A with a CR oscillation circuit 260A according to a fourth embodiment, and FIG. 13 illustrates an example of the circuit structure of the CR oscillation circuit 260A.

The hybrid circuit 201A according to the fourth embodiment is provided with an EEPROM (Electrically Erasable Programmable Read Only Memory) 290 as an example of nonvolatile memories. The EEPROM 290 has stored therein a correction value used for correcting the time constant of the CR oscillation circuit 260A, and the CR oscillation circuit 260A has an adjustment circuit 270 for adjusting the time constant of the CR oscillation circuit 260 based on a correction value.

Because remaining elements of the hybrid circuit 201A are substantially identical with those of the hybrid circuit 201 according to the third embodiment, the same reference characters, which are assigned to the corresponding elements of the hybrid circuit 201, are assigned to the remaining elements of the hybrid circuit 201A. The descriptions of the remaining elements of the CR oscillation circuit 260A are therefore omitted.

Specifically, as illustrated in FIG. 13, the CR oscillation circuit 260A is provided with the adjustment circuit 270 for adjusting the time constant $\tau$ determined by the capacitance C10 of the capacitor 261 and the resistance R10 of the resistor 262 based on the correction value stored in the EEPROM 290.

The adjustment circuit 270 is provided with a plurality of correction capacitors 270-1, 270-2, . . . , 270-n and a plurality of MOS transistors T7-1, T7-2, . . . , T7-n.

Note that the maximum capacitance required to adjust the oscillation accuracy of the CR oscillation circuit 260 is referred to as C20. The capacitances of the correction capacitors 270-1, 270-2, . . . , 270-n are therefore represented as $C20/2^1, C20/2^2, \ldots, C20/2^n$, respectively. That is, weights are assigned to the capacitances of the correction capacitors 270-1, 270-2, . . . , 270-n.

The correction capacitors 270-1 to 270-n and the MOS transistors T7-1 to T7-n are connected in series, respectively, and the correction capacitors 270-1 to 270-n are arranged in parallel to the capacitor 261.

Specifically, the n number of correction capacitors 270-1 to 270-n connected to the MOS transistors T7-1 to T7-n in series are parallely connected to the capacitor 261.

The gates of the MOS transistors T7-1 to T7-n are connected to n-bit output terminals of the EEPROM 290, respectively. The MOS transistors T7-1 to T7-n are turned on when the high level signals are outputted from the output terminals of the EEPROM 290, respectively. In addition, the MOS transistors T7-1 to T7-n are turned off when the low-level signals are outputted from the output terminals of the EEPROM 290, respectively.

Because weighs are assigned to the capacitances of the correction capacitors 270-1 to 270-n, the change of a correction capacitance (total capacitance) when the MOS transistor T7-1 is turned on and off is significant, but the change of the correction capacitance when the MOS transistor T7-n is only turned on and off is small.

In addition, when all bits of a correction value (digital value) stored in the EEPROM 290 is "1" corresponding to the high level signals, all of the MOS transistors T7-1 to T7-n are turned on. This allows a current to flow through each of the correction capacitors 270-1 to 270-n, permitting the correction capacitance (total capacitance) to substantially become the maximum capacitance of C20. In contrast, when all bits of the correction value stored in the EEPROM 290 is "0" corresponding to the low level signals, all of the MOS transistors T7-1 to T7-n are turned off. This allows a current not to flow through each of the correction capacitors 270-1 to 270-n, permitting the correction capacitance to become zero.

When all of the MOS transistors T7-1 to T7-n are turned on, the time constant τ of the CR oscillation circuit 260A is therefore represented as "τ=R10·(C10+C20)", and when all of the MOS transistors T7-1 to T7-n are tuned off, the time constant τ of the CR oscillation circuit 260A is therefore represented as "τ=R10·(C10+0)=R10·C10".

As described above, the correction capacitance (total capacitance) generated by the adjustment circuit 270 is changed depending on "on or off state" of each of the MOS transistors T7-1 to T7-n, and the change of the correction capacitance allows the oscillation frequency of the signal generated by the CR oscillation circuit 260A to be changed.

One of various patterns of on or off state of each of the MOS transistors T7-1 to 17-n has been stored in the EEPROM 290 as the correction value. Specifically, when the correction value corresponding to one of the various patterns of on or off state of each of the MOS transistors 17-1 to T7-n is stored in the EEPROM 290, the signal with the oscillation frequency corresponding to the stored correction value is outputted from the CR oscillation circuit 260A.

Rewriting of the correction value stored in the EEPROM 290 to another correction value allows the time constant τ to be changed, making it possible to correct the oscillation frequency of the signal generated by the CR oscillation circuit 260A.

Incidentally, writing and rewriting of a correction value in the EEPROM 290 can be executed while the oscillation frequency of the signal outputted from the CR oscillation circuit 260A is monitored during a check process to the hybrid circuit 201A, which is carried out after the hybrid circuit 201A has been packaged.

As set forth above, in the fourth embodiment of the present invention, it is possible for the adjustment circuit 270 that adjusts the time constant τ determined by the capacitor 261 and the resistor 262 and the EEPROM 290 to correct the oscillation frequency of the signal generated by the CR oscillation circuit 260A. This makes it possible to generate the clock whose frequency corresponds to the clock frequency of the microcomputer 202 with high accuracy. Accordingly, it is possible to integrate the CR oscillation circuit 260A capable of generating the clock with high oscillation accuracy in the hybrid circuit 201A.

In addition, the adjustment circuit 270 has the plurality of correction capacitors 270-1 to 270-n parallely connected to the capacitor 261 and the plurality of MOS transistors T7-1 to T7-n connected to the correction capacitors 270-1 to 270-n, respectively. The correction value stored in the EEPROM 290 allows the MOS transistors T7-1 to T7-n to be switched between on and off, making it possible to change the total capacitance of the correction capacitors 270-1 to 270-n parallely connected to the capacitor 261. This allows the time constant τ determined based on the capacitance of the capacitor 261 and the resistance of the resistor 262 to be adjusted.

Fifth Embodiment

Figure 14:
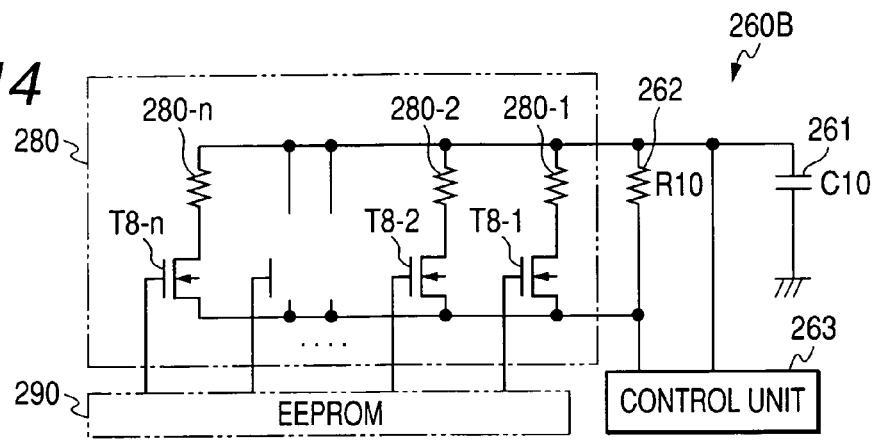
FIG. 14 is a schematic circuit diagram schematically illustrating an example of the circuit structure of a CR oscillation circuit according to a fifth embodiment of the present invention.

FIG. 14 illustrates an example of the circuit structure of a CR oscillation circuit 260B according to a fifth embodiment of the present invention.

The CR oscillation circuit 260B according to the fifth embodiment is provided with an adjustment circuit 280 for adjusting the time constant of the CR oscillation circuit 260B based on the correction value. The circuit structure of the adjustment circuit 280 is different from that of the adjustment circuit 270 according to the fourth embodiment.

Specifically, as illustrated in FIG. 14, the CR oscillation circuit 260B is provided with the adjustment circuit 280 for adjusting the time constant τ determined by the capacitance C10 of the capacitor 261 and the resistance R10 of the resistor 262 based on the correction value stored in the EEPROM 290.

The adjustment circuit 280 is provided with a plurality of correction resistors 280-1, 280-2, ..., 280-n and a plurality of MOS transistors T8-1, T8-2, ..., T8-n.

Note that the reference resistance required to adjust the oscillation accuracy of the CR oscillation circuit 260B is referred to as R20. The resistances of the correction resisters 280-1, 280-2, ..., 280-n are therefore represented as $R20/2^0$, $R20/2^1$, ..., $R20/2^{n-1}$, respectively. That is, weights are assigned to the resistances of the correction resistors 280-1, 280-2, ..., 280-n.

The correction resistors 280-1 to 280-n and the MOS transistors T8-1 to T8-n are connected in series, respectively, and the correction resistors 280-1 to 280-n are arranged in parallel to the resistor 262.

Specifically, the n number of correction resistors 280-1 to 280-n connected to the MOS transistors T8-1 to T8-n in series are parallely connected to the resistor 262.

The gates of the MOS transistors T8-1 to T8-n are connected to n-bit output terminals of the EEPROM 290, respectively. The MOS transistors T8-1 to T8-n are turned on when the high level signals are outputted from the output terminals of the EEPROM 290, respectively. In addition, the MOS transistors T8-1 to T8-n are turned off when the low-level signals are outputted from the output terminals of the EEPROM 290, respectively.

Because weighs are assigned to the resistances of the correction resistors 280-1 to 280-n, the change of a correction resistance (combined resistance) when the MOS transistor T8-1 is turned on and off is significant, but the change of the correction resistance when the MOS transistor T8-n is only turned on and off is small.

In addition, when all bits of a correction value (digital value) stored in the EEPROM 290 is "1" corresponding to the high level signals, all of the MOS transistors T8-1 to T8-n are turned on. This allows a current to flow through each of the correction resistors 280-1 to 280-n. In contrast, when all bits of the correction value stored in the EEPROM 290 is "0" corresponding to the low level signals, all of the MOS transistors T8-1 to T8-n are turned off. This allows a current not to flow through each of the correction resistors 280-1 to 280-n.

When all of the MOS transistors T8-1 to T8-n are turned on, the combined resistance, referred to as "$R_{COM}$", between the resistor 262 and the correction resistors 280-1 to 280-n is therefore represented as the following equation [1]:

$$R_{COM} = \frac{1}{\frac{1}{R10} + \frac{1}{R20/2^0} + \frac{1}{R20/2^1} + \cdots + \frac{1}{R20/2^{(n-2)}} + \frac{1}{R20/2^{(n-1)}}} \quad [1]$$

As described above, the combined resistance generated by the resistor 262 and the adjustment circuit 280 is changed depending on "on or off state" of each of the MOS transistors T8-1 to T8-n, and the change of the combined resistance allows the oscillation frequency of the signal generated by the CR oscillation circuit 260B to be changed.

One of various patterns of on or off state of each of the MOS transistors T8-1 to T8-n has been stored in the EEPROM 290 as the correction value. Specifically, when the correction value corresponding to one of the various patterns of on or off state of each of the MOS transistors T8-1 to T8-n is stored in the EEPROM 290, the signal with the oscillation frequency corresponding to the stored correction value is outputted from the CR oscillation circuit 260B.

Rewriting of the correction value stored in the EEPROM 290 to another correction value allows the time constant τ to be changed, making it possible to correct the oscillation frequency of the signal generated by the CR oscillation circuit 260B.

Incidentally, writing and rewriting of a correction value in the EEPROM 290 can be executed while the oscillation frequency of the signal outputted from the CR oscillation circuit 260B is monitored during a check process to the hybrid circuit according to the fifth embodiment after it has been packaged.

As set forth above, in the fifth embodiment of the present invention, it is possible for the adjustment circuit 280 that adjusts the time constant τ determined by the capacitor 261 and the resistor 262 and the EEPROM 290 to correct the oscillation frequency of the signal generated by the CR oscillation circuit 260B, This makes it possible to generate the clock whose frequency corresponds to the clock frequency of the microcomputer 202 with high accuracy. Accordingly, it is possible to integrate the CR oscillation circuit 26013 capable of generating the clock with high oscillation accuracy in the hybrid circuit.

In addition, the adjustment circuit 280 has the plurality of correction resistors 280-1 to 280-n parallely connected to the resistor 262 and the plurality of MOS transistors T8-1 to T8-n connected to the correction resistors 280-1 to 280-n, respectively. The correction value stored in the EEPROM 290 allows the MOS transistors T8-1 to T8-n to be switched between on and off, making it possible to change the combined resistance of the resistor 262 and the correction resistors 280-1 to 280-n parallely connected to the resistor 262. This allows the time constant τ determined based on the capacitance of the capacitor 261 and the resistance of the resistor 262 to be adjusted.

Sixth Embodiment

Figure 15:
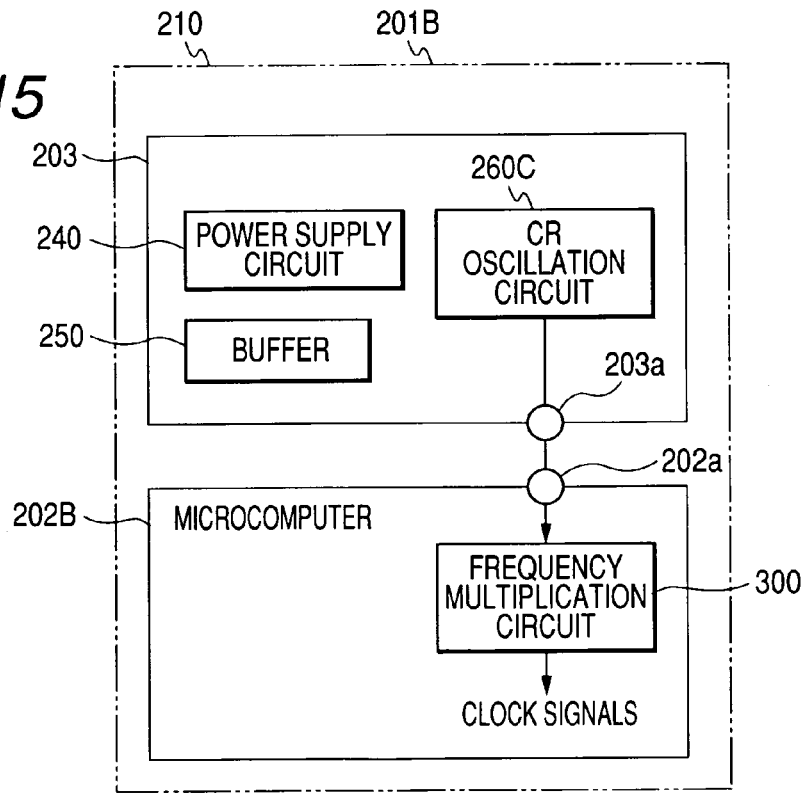
FIG. 15 is a schematic block diagram of a hybrid circuit according to a sixth embodiment of the present invention.

FIG. 15 illustrates an example of the overall structure of a hybrid circuit 201B according to a sixth embodiment of the present invention.

The hybrid circuit 201B has different points as compared with the hybrid circuit 201 according to the third embodiment as follows. That is, the microcomputer 202B of the hybrid circuit 201B is provided with a frequency multiplication circuit 300, and a CR oscillation circuit 260C is configured to output the clock with a first oscillation frequency lower than the oscillation frequency generated by the CR oscillation circuit 260 according to the third embodiment.

Specifically, the frequency multiplication circuit 300 is connected to the clock terminal 202a and is operative to multiply the first oscillation frequency of the clock generated by the CR oscillation circuit 260C so that the microcomputer 202B is operative to execute various operations in synchronization with the multiplied clock.

In the sixth embodiment, the first oscillation frequency of the clock generated by the CR oscillation circuit 260C is set to a value within a frequency range from a few tens of kHz to hundreds kHz, which are lower than the oscillation frequency of the clock generated by the CR oscillation circuit 260 according to the third embodiment. The frequency multiplication circuit 300 is operative to multiply the clock with the first oscillation frequency within the range of a few tens of kHz to hundreds kHz to generate the multiplied clock with a second oscillation frequency within the range of a few MHz to a few tens of MHz.

Note that, when adjusting an oscillation frequency using the laser trimming, it is possible to adjust the oscillation frequency that is within a comparatively low frequency range with high accuracy, as compared with adjusting the oscillation frequency within a frequency range higher than the low frequency range.

The oscillation frequency generated by the CR oscillation circuit 260C according to the sixth embodiment is therefore set to be lower than the clock frequency of the microcomputer 202B, making it possible to correct the oscillation frequency of the clock generated by the CR oscillation circuit 260C with high accuracy.

Figure 16:
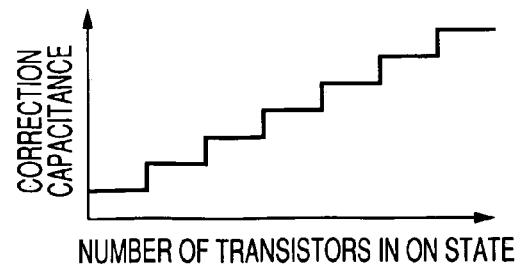
FIG. 16 is a graph schematically representing a relationship between the number of transistors in on state and the correction capacitance.

In the fourth embodiment of the present invention, weights are assigned to the capacitances of the correction capacitors 270-1 to 270-n, but the correction capacitors 270-1 to 270-n having the same capacitance, respectively, can be used. In this modification, a correction capacitance corresponding to the total capacitance of the correction capacitors 270-1 to 270-n is configured to increase depending on increase of the number of the MOS transistors T7-1 to T7-n being in on state (see FIG. 16).

In the fifth embodiment of the present invention, weights are assigned to the resistances of the correction resistors 280-1 to 280-n, but the correction resistors 280-1 to 280-n having the same capacitance, respectively, can be used.

In this case, it is possible to represent the combined resistance "$R_{COM}$" between the resistor R10 and the correction resistors 280-1 to 280-n as the following equation [2]:

$$R_{COM} = \frac{1}{\frac{1}{R10} + \frac{1}{R20} \times n_{on}} \quad [2]$$

where $n_{on}$ represents the number of transistors T8-1 to T8-n.

Seventh Embodiment

Figure 17:
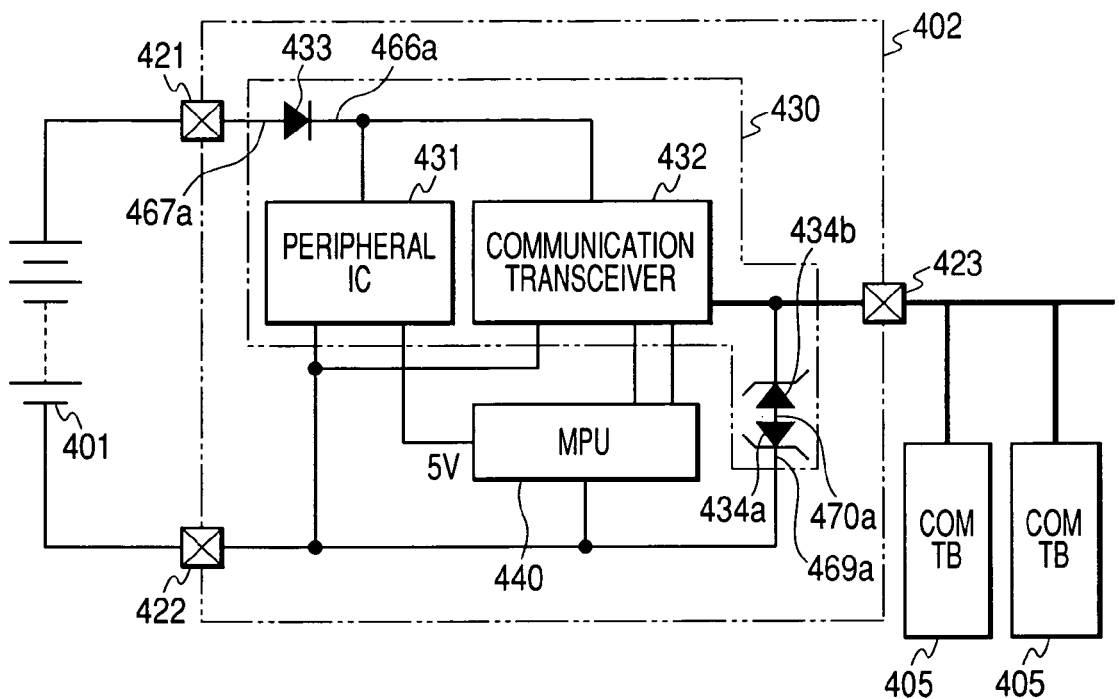
FIG. 17 is a schematic block diagram illustrating an example of the structure of an ECU according to a seventh embodiment of the present invention.

FIG. 17 illustrates an example of the structure of an ECU 402 according to a seventh embodiment of the present invention.

As illustrated in FIG. 17, the ECU 402 is provided with a semiconductor device 430 designed to a single chip. The semiconductor device 430 is provided with a peripheral IC 431 (semiconductor circuit), a communication transceiver (semiconductor circuit) 432, a reverse-connection protection diode 433, bus protection diodes 434a and 434b, and an MPU 440.

The ECU 402 has a power supply terminal 421, a ground terminal 422, and a communication bus terminal 423. The power supply terminal 421 is connected to the positive terminal of a battery 401 via a power supply cable, and the ground terminal 422 is connected to the negative terminal of the battery 401 via a power supply cable. A plurality of communication transceivers 405, 405, each referred to as "COM TB" in FIG. 17, are connected to the communication bus terminal 423 through a bus (serial communication bus) B.

The anode of the reverse-connection protection diode 433 is connected to the positive terminal of the battery 401, and the cathode thereof is connected to a power supply circuit of the peripheral IC 431 and that of the communication transceiver 432. The reverse-connection protection diode 433 can cutoff a reverse current trying to flow from a ground terminal of each of the semiconductor circuits 431 and 432 to the power supply terminal thereof when an accidental reversal of the battery 401 occurs.

The peripheral IC 431, which is similar to the control IC or the mixed IC according to the first to sixth embodiments, is connected to the MPU 440. The power supply circuit of the peripheral IC 431 is operative to generate 5 V voltage based on the battery voltage fed from the battery 401, thereby supplying the 5 V voltage to the MPU 440. In addition, the peripheral IC 431 is operative to execute operations based on write control and/or read control of the MPU 440.

The communication transceiver 432 constituting a communication circuit is connected to the MPU 440 and the communication bus terminal 423. The communication transceiver 432 is operative to transmit data inputted from the MPU 440 to at least one of the communication transceivers 405 and 405 through the bus B and the communication bus terminal 423. In addition, the communication transceiver 432 is operative to receive data transmitted from at least one of the communication transceivers 405 and 405 through the bus B, thereby transmitting the received data to the MPU 440. Specifically, the communication transceiver 432 performs two-way communications with the communication transceivers 405, 405 through the serial communication bus B.

The bus protection diodes 434a and 434b are designed to Zener diodes, respectively. The bus protection diodes 434a and 434b are connected back-to-back. Specifically, the anode of the bus protection diode 434a is connected to that of the bus protection diode 434b, and the bus protection diodes 434a and 434b are provided between the communication bus terminal 423 and the ground terminal 422.

When a potential placed between the communication bus terminal 423 and the ground terminal 422 is higher than a predetermined voltage, such as a Zener breakdown voltage of each of the bus protection diodes 434a and 434b, the bus protection diodes 434a and 434b allow a current to flow therethrough. This permits a voltage higher than the predetermined voltage not to be applied between the communication bus terminal 423 and the ground terminal 422.

The MPU 440 has stored therein programs and is operative to execute various operations based on the programs, thereby writing data into the peripheral IC 431 and the communication transceiver 432 and/or reading out data therefrom.

Next, an example of the device structure of the semiconductor device 430 will be described hereinafter. The semiconductor device 430 is designed to a single-chip device using an SOI (Silicon On Insulator) substrate.

Figure 18:
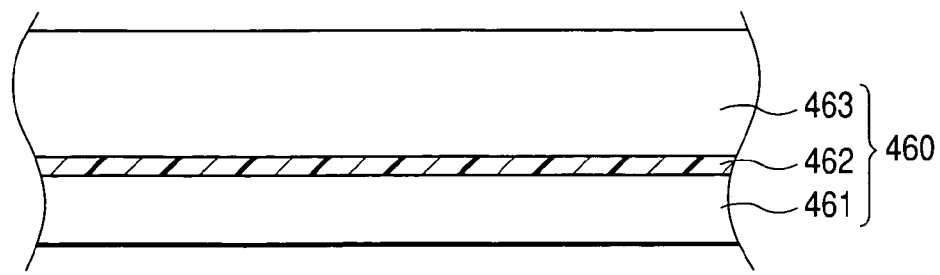
FIG. 18 is a partially cross sectional view illustrating an SOI substrate according to the seventh embodiment.

FIG. 18 illustrates a schematic cross sectional structure of the SOI substrate 460. As illustrated in FIG. 18, the SOI substrate 460 is composed of a P-type semiconductor substrate, referred to simply as "P-substrate", 461, an insulating layer, such as a silicon dioxide film, 462 mounted on the P-substrate 461, and an N-epitaxitial region 463 serving as a semiconductor layer mounted on the insulating layer 462. The p-substrate 461 is electrically connected to the ground terminal 422 of the ECU 402.

Each of the peripheral IC 431 and the communication transceiver 432 is composed of a plurality of analog and semiconductor elements, such as a power MOS FET(s), a bipolar transistor(s), a diode(s), a resistor(s), and other elements. The semiconductor circuits including the peripheral IC 431 and the communication transceiver 432, the reverse-connection protection diode 433, and the bus protection diodes 434a and 434b are formed in element-forming regions in the N-epitaxial layer 463, respectively.

Next, an example of the device structure of the reverse-connection protection diode 433 in the semiconductor device 430 will be described hereinafter with reference to FIGS. 19A and 19B.

Figure 19A:
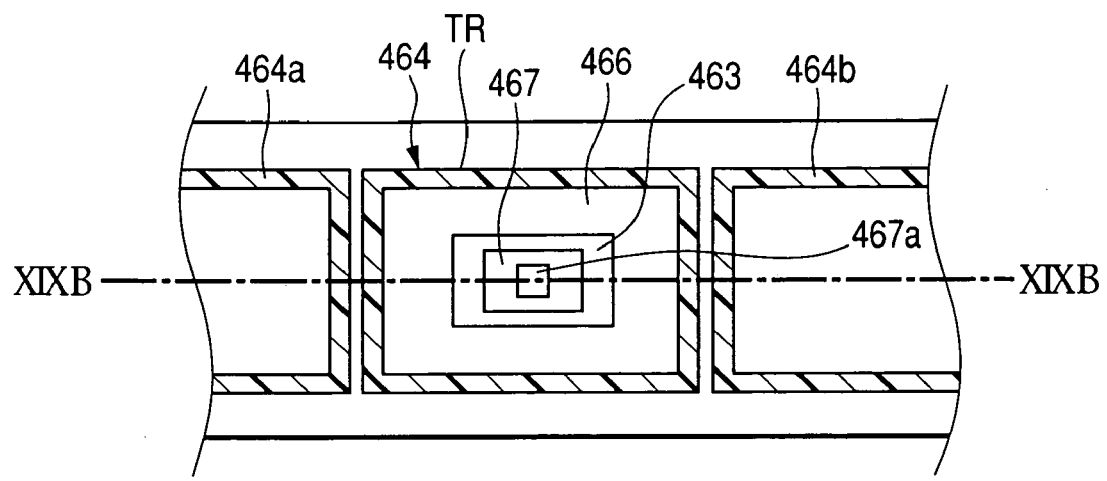
FIG. 19A is a schematic plan view of a reverse-connection protection diode illustrated in FIG. 17.

FIG. 19A is a schematic plan view of the reverse-connection protection diode 433, and FIG. 191B is a schematic cross sectional view taken on line XIXB and XIXB of FIG. 19A.

Figure 19B:
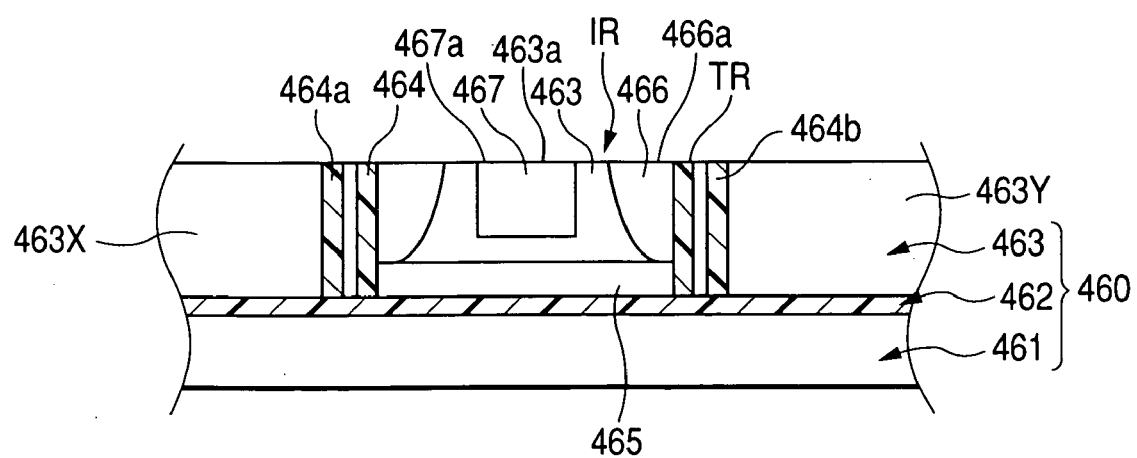
FIG. 19B is a schematic cross sectional view taken on line XIXB and XIXB of FIG. 19A.

The reverse-connection protection diode 433 is formed in the N epitaxial region 463 in the SOI substrate 460 (see FIG. 19B).

Specifically, as illustrated in FIG. 19B, a closed-loop trench TR is formed from a surface part 463a of the N epitaxial region 463 along the lamination direction of the SOI substrate 460 to reach the insulating layer 462; this lamination direction corresponds to the width direction of the N epitaxial region 463.

Part of the insulating layer (silicon dioxide film) 462 communicating with the trench TR is thermally oxidized so that a closed-loop insulating layer 464 is formed in the trench TR to be integrated with the insulating layer 462. The insulating layer 464 is configured to surround an element-forming region consisting of the N epitaxial region 463, a deep N+ region 466, and a P+ region 467 (see FIG. 19A). That is, the closed-loop insulating layer 464 and the insulating layer 462 provide an island region IR that is completely electrically isolated from the P-substrate 461 and the N epitaxial region 463 in the SOI substrate 460, A buried N+ region 465, the deep N+ region 466, and the P+ region 467 are formed by ion implantation and thermal diffusion in the island region IR in the N epitaxial layer 463.

Specifically, N-type impurities (dopants) are ion implanted into the N epitaxial layer 463 to be diffused therein so that the buried N+ region 465 is formed on the insulating layer 462. N type impurities are ion implanted into the N epitaxial layer 463 to be deeply diffused therein so that the deep N+ region 466 with a closed loop shape is formed at the periphery of the island region IR on the buried N+ region 465.

P-type impurities are ion implanted into the N epitaxial layer 463 to be diffused therein so that the P+ region 467 is formed in the N epitaxial layer 463 to be adjacent to the surface part 463a thereof. The P+ region 467 is separated from the deep N+ region 466 by the remaining N epitaxial layer 463.

The impurity concentrations of the buried N+ region 465, the deep N+ region 466, and the P+ region 467 are higher than that of the N epitaxial region 463. The N epitaxial region 463, the buried N+ region 465, and the deep N+ region 466 become the cathode region of the reverse-connection protection diode 433, and the P+ region 467 becomes the anode region thereof.

On the other hand, as illustrated in FIGS. 19A and 19B, the N epitaxial layer 463 in which the anode region and the cathode region are formed is insulated from the P-substrate 461, part 463X of the N epitaxial layer 463, and part 463Y thereof by the insulating layers 462 and 464. In one of the parts 463X and 463Y of the N epitaxial layer 463, the peripheral IC 431 is formed; in the other thereof, the communication transceiver 432 is formed.

A cathode electrode 466a is formed on a surface portion of the deep N+ region 466, and the cathode electrode 466a is connected to each of the power supply terminals of the peripheral IC 431 and the communication transceiver 432.

An anode electrode 467a is formed on a surface portion of the P+ region 467, and the anode electrode 467a is connected to the positive terminal of the battery 401 using wire boding or the like.

When an accidental reversal of the battery 401 occurs, a voltage, which approximately equals to the voltage of the battery 401, may be applied across the reverse-connection protection diode 433. The dimensions and the impurity concentration of each of the regions 463, 465, 466, and 467 are therefore determined such that the breakdown voltage of the reverse-connection protection diode 433 is higher than the voltage of the battery 401.

In the structure of the semiconductor device 430, the reverse-connection protection diode 433 is fabricated in the SOI substrate 460 together with the peripheral IC 431 and the communication transceiver 432. Because the insulating layer 462 is formed between the P-substrate 461 and the N epitaxial layer 463 as the semiconductor layer such that the P-substrate 461 and the N epitaxial layer 463 are electrically isolated from each other, no PN junction between the P-substrate 461 and the N epitaxial layer 463 is formed.

Even if an accidental reversal of the battery 401 occurs, no reverse currents flow from the P-substrate 461 (the ground terminal) to the power supply terminals of the peripheral IC 431 and the communication transceiver 432.

This allows the reverse-connection protection diode 433 to be fabricated in the same chip (the same substrate 460) together with at least one of the semiconductor circuits 431 and 432 without preventing the reverse currents from flowing from the ground terminal to the power supply terminal of at least one of the semiconductor circuits 431 and 432.

In addition, the buried N+ region 465 and the deep N+ region 466 are separated from the P+ region 467 through the N epitaxial layer 463, and the impurity concentrations of the buried N+ region 465 and the deep N+ region 466 are higher than that of the N epitaxial layer 463. This permits a resistance between the P+ region 467 as the anode region and the deep N+ region 466 to become low, making it possible to cause a comparatively high current to flow through the reverse-connection protection diode 433.

Next, an example of the device structure of each of the bus protection diodes 434a and 434b in the semiconductor device 430 will be described hereinafter with reference to FIG. 20. Note that, because the device structure of the bus protection diode 434a and that of the bus protection diode 434b are substantially identical with each other, the device structure of the bus protection diode 434a will be only described.

Figure 20:
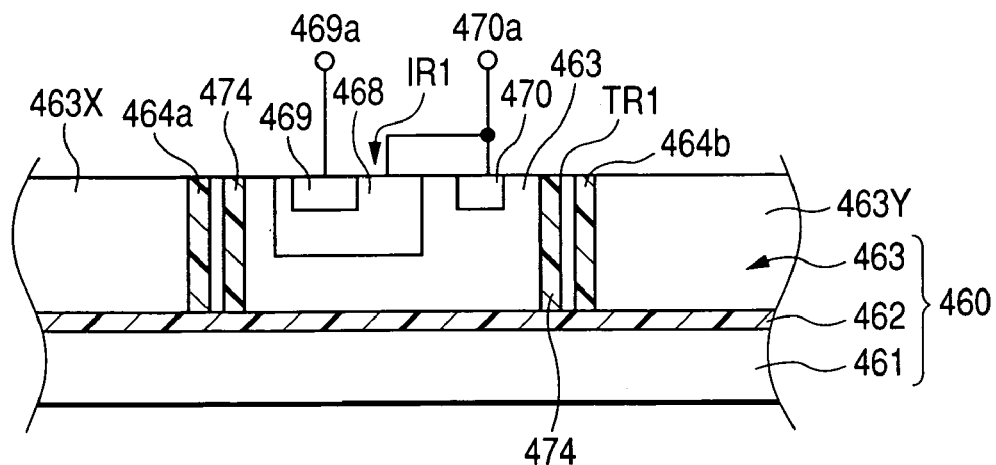
FIG. 20 is a schematic cross sectional view of the bus protection diode in a semiconductor device illustrated in FIG. 17.
Figure 21:
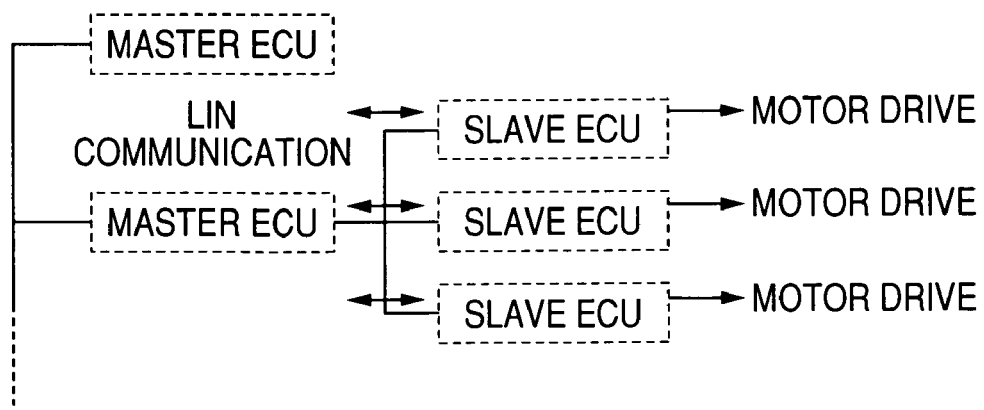
FIG. 21 is a view illustrating a structural example of an in-vehicle LAN using a LIN protocol.
Figure 22:
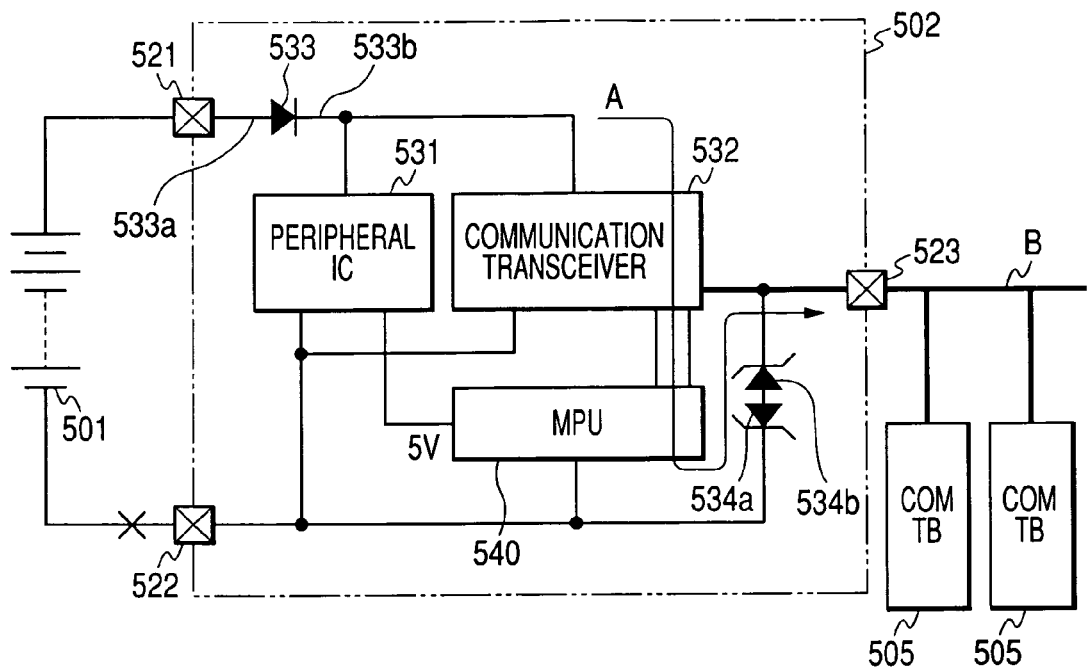
Figure 23:
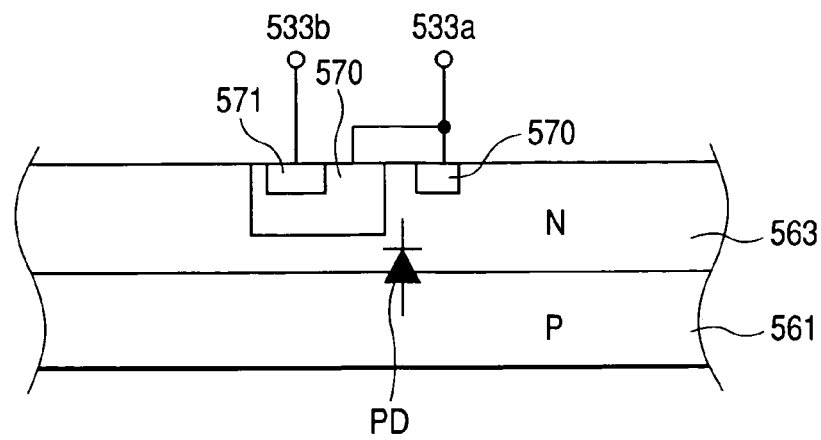
FIG. 23 is a schematic cross sectional view of one of diodes formed in a substrate in which a peripheral IC or a communication transceiver is fabricated.

FIG. 20 is a schematic cross sectional view of the bus protection diode 434a in the semiconductor device 430.

The bus protection diode 434a is formed in the N epitaxial region 463 in the SOI substrate 460 (see FIG. 20), which is similar to the reverse-connection protection diode 433.

Specifically, as illustrated in FIG. 20, a closed-loop trench TRI is formed from the surface part 463a of the N epitaxial region 463 along the width direction of the N epitaxial region 463 to reach the insulating layer 462.

Part of the insulating layer (silicon dioxide film) 462 communicating with the trench TR1 is thermally oxidized so that a closed-loop insulating layer 474 is formed in the trench TR1 to be integrated with the insulating layer 462. The insulating layer 474 is configured to surround the N epitaxial region 463 (see FIG. 20). That is, the closed-loop insulating layer 474 and the insulating layer 462 provide an island region IRI that is completely electrically isolated from the P-substrate 461 in the SOI substrate 460.

A P+ region 468, an N+ region 469, and a conductive contact region 470 are formed by ion implantation and thermal diffusion in the island region IR1 in the N epitaxial layer 463.

The P+ region 468, the N epitaxial layer 463, and the contact region 470 serve as the anode region of the bus protection diode 434a, and the N+ region 469 serves as the cathode region thereof.

Note that Zener diodes are commonly composed of a junction between N− region and P+ region so that Zener breakdown voltages are comparatively high. The Zener diode 434a according to the seventh embodiment is however composed of a junction between the P+ region 468 and the N+ region 469 so that a Zener breakdown voltage is lower than that of each of the common Zener diodes.

A cathode electrode is formed on a surface portion of the N+ region 469, and the cathode electrode is connected to a cathode terminal 469a of the bus protection diode 434a using wire bonding or the like. An anode electrode is formed on each of a surface portion of the N epitaxial region 463 and the P+ region 468, and each of the anode electrodes is connected to an anode terminal 470a of the bus protection diode 434a using wire bonding or the like.

In the structure of the semiconductor device 430, each of the bus protection diodes 434a and 434b is fabricated in the SOI substrate 460 together with the peripheral IC 431 and the communication transceiver 432. Because the insulating layer 462 is formed between the P-substrate 461 and the N epitaxial layer 463 as the semiconductor layer such that the P-substrate 461 and the N epitaxial layer 463 are completely electrically isolated from each other, no PN junction between the P-substrate 461 and the N epitaxial layer 463 is formed.

Even if breaking of the power supply cable or disconnection thereof between the negative terminal of the battery 401 and the ground terminal 422 of the ECU 402 occurs, no currents flow to the communication bus B because no forwardly biased PN junction between the P-substrate 461 and the N epitaxial layer 463.

This allows each of the bus protection diodes 434a and 434b to be fabricated in the same chip (the same substrate 460) together with at least one of the semiconductor circuits 431 and 432.

In addition, as described above, each of the peripheral IC 431 and the communication transceiver 432 is composed of the plurality of analog and semiconductor elements. The plurality of analog and semiconductor elements of the peripheral IC 431 are formed in one of the parts 463X and 463Y of the N epitaxial layer 463. Similarly, the plurality of analog and semiconductor elements of the communication transceiver 432 are formed in the other of the parts 463X and 463Y of the N epitaxial layer 463.

Like the reverse-connection protection diode 433 and the bus protection diodes 434a and 434b, the plurality of analog and semiconductor elements of the peripheral IC 431 are electrically isolated from the P-substrate 461 through the insulating layer 462 and an insulating layer 464a that has substantially identical configuration of the insulating layer 464 (see FIGS. 19 and 20). Similarly, the plurality of analog and semiconductor elements of the communication transceiver 432 are electrically isolated from the P-substrate 461 through the insulating layer 462 and an insulating layer 464b that has substantially identical configuration of the insulating layer 464 (see FIGS. 19 and 20).

In the first embodiment of the present invention, the door ECU has been described as an example of electronic units, but the present invention can be applied to various ECUs each configured to drive various loads.

In the first embodiment, the control IC 10, the microcomputer 80, and the capacitor 71 are mounted on the multilayer board 2a, and the power transistors 91 to 94 as the load drive circuit 90 are mounted on the single layer board 2b. The present invention, however, is not limited to the structure. Specifically, the control IC 10, the microcomputer 80, the capacitor 71, and the power transistors 91 to 94 as the load drive circuit 90 can be mounted on a common single board (substrate).

In the first embodiment of the present invention, the door ECU 1 as a slave ECU bi-directionally communicates with a master ECU based on the LIN protocol, but the door ECU can bi-directionally communicate with a master ECU based on another communication protocol, such as the CAN protocol.

In the first embodiment of the present invention, the microcomputer 80 is checked using the check terminals, but in addition to the check, outputs of the control IC 10 to the load drive circuit 90 can be checked using the check terminals.

The number of the input terminals, the number of the output terminals, and the number of the check terminals, which have been described in the first embodiment, are an example. Similarly, the functions assigned to the input terminals, the functions assigned to the output terminals, and the functions assigned to the check terminals, which have been described in the first embodiment, are also an example.

For example, as the input terminals, a mode setting terminal for externally setting the mode of the microcomputer 80, a reset terminal for external input of a reset signal to reset the microcomputer 80, and other terminals can be provided. In addition, as the output terminals, a sensor power supply terminal for supply of power to a temperature sensor sensing a temperature of the motor, a sensor input terminal for input of motor temperature information based on the sensed data by the temperature sensor, and other terminals can be provided.

In the first embodiment, the outside shape of the package 8 is a substantially cuboid shape. The concept of "cuboid shape" can include that the outside shape of the package 8 is a substantially rectangular parallelepiped shape or a substantially cubic shape. Furthermore, the outside shape of the package 8 is a substantially cuboid shape, but the present invention is not limited to the structure. Specifically, the package 8 can be shaped such that it has a plurality of sides around the periphery of the multilayer board 2a and/or the single layer board 2b.

In the second embodiment, as an example of units that can operate in the active mode with a normal current drain and can operate in the low current drain mode with a low current drain, the microcomputer 142 is described. In the present invention, as units that can operate in the active mode with a normal current drain and can operate in the low current drain mode with a low current drain, semiconductor devices for communications, for example, the semiconductor device 430 according to the seventh embodiment can be applied.

In the second embodiment of the present invention, the first and second power supply circuits 20A and 30A include constant voltage switching functions therebetween as the switching element 111.

Specifically, when the switching signal indicative of the low current drain mode is inputted from the microcomputer 142 into the first power supply circuit 20A, the constant voltage outputted from the second power supply circuit 30A is switched from the constant voltage outputted from the first power supply circuit 20A. In contrast, when the switching signal indicative of the active mode is inputted from the microcomputer 142 into the first power supply circuit 20A, the constant voltage outputted from the first power supply circuit 20A is switched from the constant voltage outputted from the second power supply circuit 30A.

In the present invention, however, a discrete switching element, such as a relay, can be provided for switching any one of the constant voltage outputted from the first power supply circuit 20A and that of the constant voltage outputted from the second power supply circuit 30A based on the switching signal sent from the microcomputer 142.

In the second embodiment of the present invention, the power supply circuit 141 for microcomputers is provided in the LSI 140 as a load, but the power supply circuit 141 for microcomputers can be provided in the power supply module PMA of the mixed IC 101.

In the sixth embodiment of the present invention, the microcomputer 202B is provided with the frequency multiplication circuit 300 operative to multiply the first oscillation frequency of the clock generated by the CR oscillation circuit 260C so that the microcomputer 202B is operative to execute various operations in synchronization with the multiplied clock. The frequency multiplication circuit 300 can be applied to the microcomputers according to the third to fifth embodiments.

In the third to sixth embodiments, each of the electronic units is configured such that the mixed IC and the microcomputer are mounted on the substrate. However, each of the electronic units can be configured such that the mixed IC and the microcomputer are mounted on a lead frame as a multichip package.

Laser trimming like the third embodiment can be carried out with respect to the correction resistors 280-1 to 280-n of the adjustment circuit 280 illustrated in FIG. 14. Similarly, laser trimming like the third embodiment can be carried out with respect to the resistor 262 and the correction resistors 280-1 to 280-n of the adjustment circuit 280 illustrated in FIG. 14.

The CR oscillation circuits according to the third to sixth embodiments can include both the adjustment circuits 270 and 280.

In the fourth and fifth embodiments, as an example of nonvolatile memories, the EEPROM is used for storing the correction value, but an EPROM (Erasable Programmable Read Only Memory) and a flash ROM can be used in place of the EEPROM.

In the fourth and fifth embodiments, writing and rewriting of a correction value in at least one of nonvolatile memories, such as the EEPROM, can be executed from the microcomputer and/or the mixed IC. In addition, the at least one of the nonvolatile memories can be installed in the mixed IC.

In the fourth and fifth embodiments, correction of the time constant τ determined by the resistance of the resistor 262 and the capacitance of the capacitor 261 can be carried out with the resistor 262 and the capacitor 261 being on the wafer. Thereafter, writing and rewriting of a correction value in at least one of the nonvolatile memories can be executed.

In the seventh embodiment, the anode of the Zener diode 434a is connected to that of the Zener diode 434b, and the Zener diodes 434a and 434b are provided between the communication bus terminal 423 and the ground terminal 422. The present invention, however, is not limited to the structure.

Specifically, a single Zener diode can be provided between the communication bus terminal 423 and the ground terminal 422 such that the anode of the single Zener diode is connected to the ground terminal 422, and the cathode thereof is connected to the communication bus terminal 423. The single Zener diode can mainly protect the communication transceiver from surges and/or noises.

In addition, a single Zener diode can be provided between the communication bus terminal 423 and the ground terminal 422 such that the cathode of the single Zener diode is connected to the ground terminal 422, and the anode thereof is connected to the communication bus terminal 423. The single Zener diode can mainly protect communications between the communication transceivers 505 through the communication bus terminal 523.

Furthermore, a plurality of Zener diodes serially connected to each other in anode-to-anode connection or cathode-to-cathode connection can be provided between the communication bus terminal 423 and the ground terminal 422.

In the seventh embodiment, Zener diodes are used for bus protection diodes, but the other diodes except for the Zener diodes, which are connected like the Zener diodes 434a and 434b, can be used for the bus protection diode. In this case, the breakdown voltages of the other diodes can be used.

In the seventh embodiment, the insulating layers 462 and 464 can be formed using an oxide-film isolation process, but the insulating layers 462 and 464 can be formed using dielectric isolation process for electrically isolating with dielectrics.

In the seventh embodiment, as the communication circuit, the communication transceiver for interactively communicating with other devices, but a transmitting circuit or a receiving circuit can be used as the communication circuit.

In the seventh embodiment, the semiconductor device 430 is installed in an ECU installed in a vehicle, but the semiconductor device 430 can be installed in a common communication unit.

In the seventh embodiment, the SOI substrate in which the insulating layer 462 has already been formed is used, but a silicon dioxide film (insulating layer) can be formed in a wafer using an SIMOX (Silicon Implanted Oxide) method.

The power supply modules according to the first or second embodiment can be installed in the mixed ICs according to the third to sixth embodiments, and the peripheral ICs according to the seventh embodiment.

The CR oscillation circuits according to the third to sixth embodiments can be installed in the control ICs according to the first embodiment, the mixed ICs according to the second embodiments, and the peripheral ICs according to the seventh embodiment.

The substrate structures related to the insulating layers 462 and 464 and disclosed in the seventh embodiment can be applied to the substrate structures according to the first to sixth embodiments.

While there has been described what is at present considered to be these embodiments and modifications of the present invention, it will be understood that various modifications which are not described yet may be made therein, and it is intended to cover in the appended claims all such modifications as fall within the true spirit and scope of the invention.

What is claimed is:

1. An electronic unit with a substrate, the electronic unit comprising:
    a control circuit mounted on the substrate and configured to execute a control operation related to a load;
    a package encapsulating the control circuit and the substrate, the package having a plurality of surfaces around a periphery of the substrate;
    at least one input terminal for input of a signal externally sent to the electronic unit, the at least one input terminal being disposed on at least one of the plurality of surfaces;
    at least one output terminal for output of a control signal for controlling the load, the at least one output terminal being disposed on at least another one of the plurality of surfaces; and
    at least one check terminal for input/output of a signal for checking at least the control circuit, the at least one check terminal being disposed on at least another one of the plurality of surfaces; wherein
    at least another one of the plurality of surfaces on which the at least one check terminal is disposed has a concave portion, and the at least one check terminal is disposed on the concave portion that allows the at least one check terminal not to project from an outline of a portion of at least another one of the plurality of surfaces except for the concave portion.

2. An electronic unit with a substrate, the electronic unit comprising:
    a control circuit mounted on the substrate and configured to execute a control operation related to a load;
    a package encapsulating the control circuit and the substrate, the package having a plurality of surfaces around a periphery of the substrate;
    at least one input terminal for input of a signal externally sent to the electronic unit, the at least one input terminal being disposed on at least one of the plurality of surfaces;
    at least one output terminal for output of a control signal for controlling the load, the at least one output terminal being disposed on at least another one of the plurality of surfaces; and
    at least one check terminal for input/output of a signal for checking at least the control circuit, the at least one check terminal being disposed on at least another one of the plurality of surfaces; wherein
    the at least one output terminal consists of a plurality of output terminals parallely arranged to each other, and the plurality of output terminals includes a battery terminal connected to a positive terminal of a battery, two load connection terminals connected to the load, and two ground terminals connected to a negative terminal of the battery, and wherein the two load connection terminals are arranged on both sides of the battery terminal, and the two ground terminal are arranged outside to the load connection terminals, respectively.

3. An electronic unit with a substrate, the electronic unit comprising:
    a control circuit mounted on the substrate and configured to execute a control operation related to a load;
    a package encapsulating the control circuit and the substrate, the package having a plurality of surfaces around a periphery of the substrate;
    at least one input terminal for input of a signal externally sent to the electronic unit, the at least one input terminal being disposed on at least one of the plurality of surfaces;
    at least one output terminal for output of a control signal for controlling the load, the at least one output terminal being disposed on at least another one of the plurality of surfaces;
    at least one check terminal for input/output of a signal for checking at least the control circuit, the at least one check terminal being disposed on at least another one of the plurality of surfaces; and further comprising
    an integrated circuit mounted on the substrate and connected to the control circuit, and a load drive circuit mounted on the substrate and connected to the integrated circuit, the load drive circuit driving the load, the control unit being configured to generate a control signal for drive of the load, the integrated circuit being configured to control the load drive circuit based on the generated control signal, and wherein the control circuit, the integrated circuit, and the load drive circuit are arranged on the substrate such that the integrated circuit is interposed between the control circuit and the load drive circuit.

4. An electronic unit according to claim 3, wherein the control circuit, the integrated circuit, and the load drive circuit are designed to chip modules to be mounted as bare chips on the substrate, respectively.

5. An electronic unit with a substrate, the electronic unit comprising:

a control circuit mounted on the substrate and configured to execute a control operation related to a load;

a package encapsulating the control circuit and the substrate, the package having a plurality of surfaces around a periphery of the substrate;

at least one input terminal for input of a signal externally sent to the electronic unit, the at least one input terminal being disposed on at least one of the plurality of surfaces;

at least one output terminal for output of a control signal for controlling the load, the at least one output terminal being disposed on at least another one of the plurality of surfaces;

at least one check terminal for input/output of a signal for checking at least the control circuit, the at least one check terminal being disposed on at least another one of the plurality of surfaces; and further comprising an integrated circuit mounted on the substrate and connected to the control circuit, and a load drive circuit mounted on the substrate and connected to the integrated circuit, the load drive circuit driving the load, the control unit being configured to generate a control signal for drive of the load, the integrated circuit being configured to control the load drive circuit based on the generated control signal, and wherein the control circuit, the integrated circuit, and the load drive circuit are arranged on the substrate such that the integrated circuit is interposed between the control circuit and the load drive circuit; wherein a signal externally inputted to the electronic unit has a voltage level higher than an input voltage level of the control circuit, and the integrated circuit comprises a voltage level converting unit configured to convert the voltage level of the signal externally inputted into the input voltage level of the control circuit.

6. An electronic unit with a substrate, the electronic unit comprising:

a control circuit mounted on the substrate and configured to execute a control operation related to a load;

a package encapsulating the control circuit and the substrate, the package having a plurality of surfaces around a periphery of the substrate;

at least one input terminal for input of a signal externally sent to the electronic unit, the at least one input terminal being disposed on at least one of the plurality of surfaces;

at least one output terminal for output of a control signal for controlling the load, the at least one output terminal being disposed on at least another one of the plurality of surfaces; and at least one check terminal for input/output of a signal for checking at least the control circuit, the at least one check terminal being disposed on at least another one of the plurality of surfaces; and further comprising an integrated circuit mounted on the substrate and connected to the control circuit, and a load drive circuit mounted on the substrate and connected to the integrated circuit, the load drive circuit driving the load, the control unit being configured to generate a control signal for drive of the load, the integrated circuit being configured to control the load drive circuit based on the generated control signal, and wherein the control circuit, the integrated circuit, and the load drive circuit are arranged on the substrate such that the integrated circuit is interposed between the control circuit and the load drive circuit;

wherein the control circuit operates in an active mode with a first current drain and in a low current drain mode with a second current drain lower than the first current drain, and the integrated circuit comprises:

a first power supply circuit configured to output a first constant voltage; and a second power supply circuit configured to output a second constant voltage with a low current drain lower than that of the first power supply circuit, the integrated circuit being configured to select the first constant voltage for the control circuit while the control circuit operates in the active mode, and to select the second constant voltage for the control circuit while the control circuit operates in the low current drain mode.

7. An electronic unit according to claim 6, further comprising a power supply line through which any one of the first constant voltage and the second constant voltage is supplied from the integrated circuit to the control circuit, and a capacitor connected between the power supply line and a ground and configured to suppress a noise transferred through the power supply line.

8. An electronic unit according to claim 6, wherein the integrated circuit comprises a switching circuit configured to switch the first constant voltage from the first power supply circuit to output it to the control circuit while the control circuit operates in the active mode, and to switch the second constant voltage from the second constant voltage to output it to the control circuit while the control circuit operates in the low current drain mode.

9. An electronic unit according to claim 6, wherein the first power supply circuit has a first output terminal, the second power supply circuit has a second output terminal connected to the first output terminal, the second constant voltage is lower than the first constant voltage, and the second power supply circuit comprises an output circuit configured to output the second constant voltage when a potential at the second output terminal is lower than the second constant voltage and to interrupt the output of the second constant voltage when the potential at the second output terminal is higher than the second constant voltage.

10. An electronic unit according to claim 9, wherein the output circuit comprises an output stage transistor with a base and an emitter, a constant voltage being applied to the base, the output stage transistor being configured to output the second constant voltage from the emitter, and wherein the emitter of the output stage transistor is connected to the first output terminal of the first power supply circuit.

11. An electronic unit according to claim 8, wherein the switching circuit is integrated with the first power supply circuit and is configured to:

cause the first power supply circuit to output the first constant voltage when a switching signal indicative of the active mode is sent from the control circuit; and cause the first power supply circuit to interrupt the output of the first constant voltage when the switching signal indicative of the low current drain mode is sent from the control circuit.

12. An electronic unit according to claim 6, wherein the first power supply circuit has a capacity to supply current higher than a current drain of the load when the control circuit operates in the active mode, and the second power supply circuit has a capacity to supply current higher than a current drain of the load when the control circuit operates in the low current drain mode.

13. An electronic unit according to claim 6, wherein the second power supply circuit has a Zener diode operative to generate the second constant voltage, the second power supply circuit being configured to output the second constant voltage generated by the Zener diode to the control circuit while the control circuit operates in the low current mode.

14. An electronic unit according to claim 6, further comprising a power supply circuit configured to:
  generate a constant voltage based on one of the first constant voltage outputted from the first power supply circuit and the second constant voltage outputted from the second power supply circuit, the generated constant voltage being different from each of the first and second constant voltages; and
  supply the generated constant voltage to the control circuit.

* * * * *